US012665037B2

(12) United States Patent
Choi et al.

(10) Patent No.: US 12,665,037 B2
(45) Date of Patent: Jun. 23, 2026

(54) MEMORY DEVICE INCLUDING CHARGE PUMP FOR GENERATING VOLTAGE AND OPERATING METHOD THEREOF

(71) Applicant: SK hynix Inc., Icheon-si (KR)

(72) Inventors: Won Jae Choi, Icheon-si (KR); Chang Hee Lee, Icheon-si (KR); Hyun Chul Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 176 days.

(21) Appl. No.: 18/430,892

(22) Filed: Feb. 2, 2024

(65) Prior Publication Data

US 2025/0054554 A1     Feb. 13, 2025

(30) Foreign Application Priority Data

Aug. 8, 2023     (KR) ......................... 10-2023-0103402

(51) Int. Cl.
G11C 16/30 (2006.01)
G11C 16/04 (2006.01)
G11C 16/24 (2006.01)

(52) U.S. Cl.
CPC .......... G11C 16/30 (2013.01); G11C 16/0483 (2013.01); G11C 16/24 (2013.01)

(58) Field of Classification Search
CPC ...... G11C 16/30; G11C 16/0483; G11C 16/24
USPC ................................................... 365/185.27
See application file for complete search history.

(56) References Cited

U.S. PATENT DOCUMENTS

| | | | |
|---|---|---|---|
| 9,711,227 B1 * | 7/2017 | Ghai ...................... | G11C 16/14 |
| 11,205,486 B2 | 12/2021 | Choi et al. | |
| 2009/0225600 A1 * | 9/2009 | Park .................... | G11C 11/5628 |
| | | | 365/185.11 |
| 2015/0002195 A1 * | 1/2015 | Englekirk ............... | H02M 3/07 |
| | | | 327/157 |
| 2021/0366555 A1 * | 11/2021 | Choi ...................... | G11C 5/145 |
| 2023/0024668 A1 | 1/2023 | Choi et al. | |

FOREIGN PATENT DOCUMENTS

| | | |
|---|---|---|
| KR | 1020110131208 A | 12/2011 |
| KR | 1020210011251 A | 2/2021 |
| KR | 1020210142986 A | 11/2021 |

* cited by examiner

*Primary Examiner* — Alexander Sofocleous
*Assistant Examiner* — Duy H Luong
(74) *Attorney, Agent, or Firm* — WILLIAM PARK AND ASSOCIATES LTD.

(57) ABSTRACT

According to an embodiment of the present disclosure, a memory device includes a memory cell array including a plurality of planes; a charge pump configured to generate an operating voltage used for an operation on each of the plurality of planes according to a first clock signal having a first cycle; page buffers each configured to store pass data representing whether an operation of each of the plurality of planes has been completed; and an operation control circuit configured to, based on a number of the pass data received from the page buffers, control the charge pump to generate the operating voltage according to a second clock signal having a second cycle that is longer than the first cycle.

22 Claims, 13 Drawing Sheets

Figure 12:
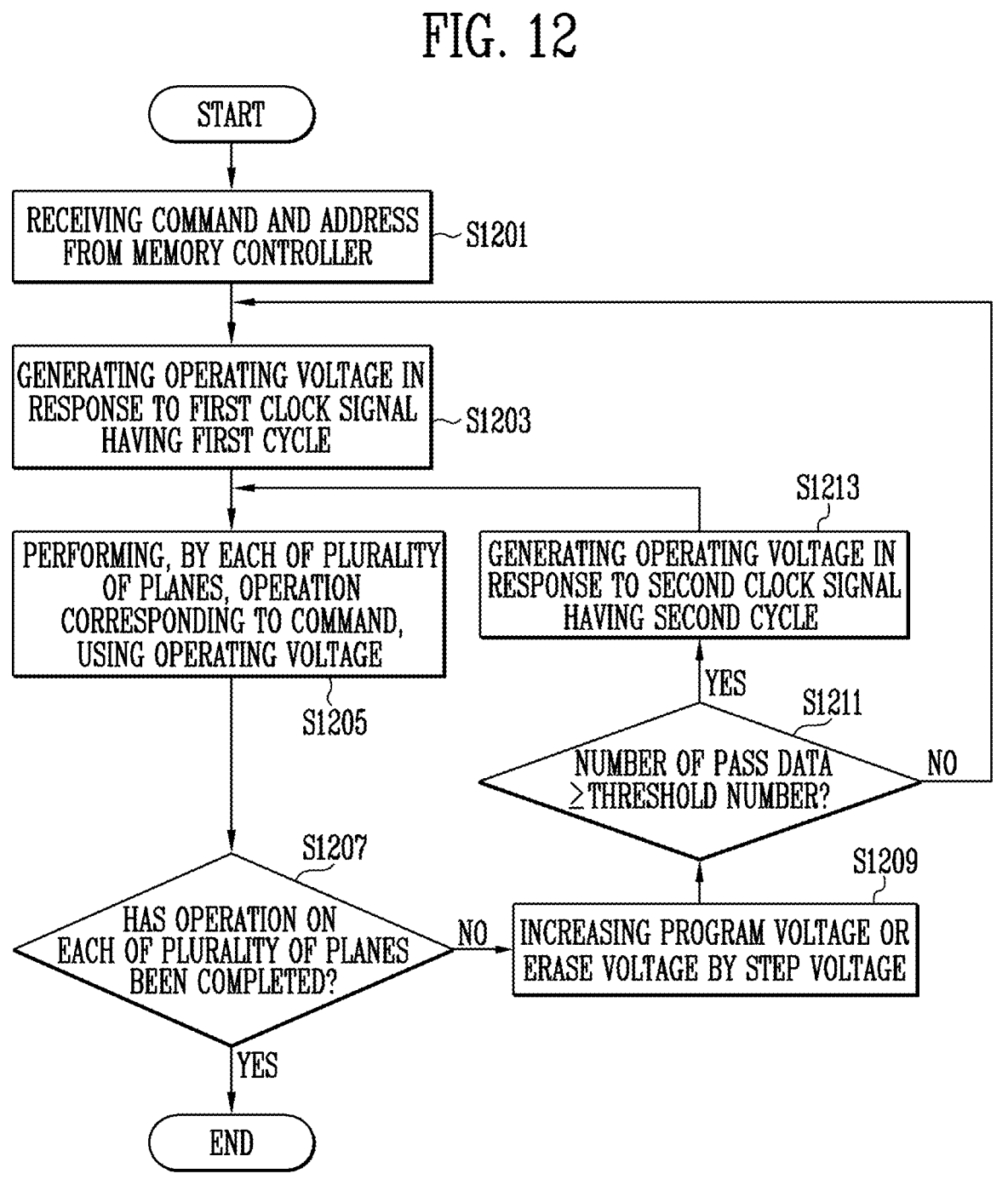

START

RECEIVING COMMAND AND ADDRESS FROM MEMORY CONTROLLER — S1201

GENERATING OPERATING VOLTAGE IN RESPONSE TO FIRST CLOCK SIGNAL HAVING FIRST CYCLE — S1203

PERFORMING, BY EACH OF PLURALITY OF PLANES, OPERATION CORRESPONDING TO COMMAND, USING OPERATING VOLTAGE — S1205

S1213
GENERATING OPERATING VOLTAGE IN RESPONSE TO SECOND CLOCK SIGNAL HAVING SECOND CYCLE

YES
S1211
NUMBER OF PASS DATA ≥ THRESHOLD NUMBER?    NO

S1207
HAS OPERATION ON EACH OF PLURALITY OF PLANES BEEN COMPLETED?    NO    INCREASING PROGRAM VOLTAGE OR ERASE VOLTAGE BY STEP VOLTAGE    S1209

YES

END

MEMORY DEVICE INCLUDING CHARGE PUMP FOR GENERATING VOLTAGE AND OPERATING METHOD THEREOF

CROSS-REFERENCE TO RELATED APPLICATION

The present application claims priority under 35 U.S.C. § 119 (a) to Korean patent application number 10-2023-0103402 filed on Aug. 8, 2023, in the Korean Intellectual Property Office, the entire disclosure of which is incorporated by reference herein.

BACKGROUND

1. Technical Field

The present disclosure generally relates to an electronic device, and more particularly, to a memory device including a charge pump for generating a voltage and an operating method thereof.

2. Related Art

A memory system is a device which stores data under the control of a host device such as a computer or a smart phone. The memory system may include a memory device for storing data and a memory controller for controlling the memory device. The memory device is classified into a volatile memory device and a nonvolatile memory device.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

The nonvolatile memory device may include a charge pump for generating a voltage used for an operation. The charge pump may generate a voltage in response to a clock signal. An amount of current consumed in generating the voltage may vary according to a cycle of the clock signal. An amount of current consumed by the charge pump may increase as the cycle of the clock signal becomes shorter.

SUMMARY

In accordance with an aspect of the present disclosure, there is provided a memory device including: a memory cell array including a plurality of planes; a charge pump configured to generate an operating voltage used for an operation on each of the plurality of planes according to a first clock signal having a first cycle; page buffers each configured to store pass data representing whether an operation of each of the plurality of planes has been completed; and an operation control circuit configured to, based on a number of the pass data received from the page buffers, control the charge pump to generate the operating voltage according to a second clock signal having a second cycle that is longer than the first cycle.

In accordance with another aspect of the present disclosure, there is provided a memory device including: a plurality of memory blocks included in different planes; a clock generating circuit configured to generate a clock signal; a charge pump configured to generate an operating voltage to be applied to each of the plurality of memory blocks in response to the clock signal; and an operation control circuit configured to, based on a number of memory blocks on which an operation corresponding to a command has been completed, among the plurality of memory blocks, control the clock generating circuit to change a cycle of the clock signal from a first cycle to a second cycle that is longer than the first cycle.

In accordance with another aspect of the present disclosure, there is provided a memory device comprising a memory cell array and a control circuit. The memory cell array may include a plurality of planes. The control circuit may be configured to generate a first clock having a first period when a number of an operating plane of the plurality of planes is greater than a threshold number, and generate a second clock having a second period longer than the first period when the number of the operating plane of the plurality of planes is equal to or less than the threshold number.

In accordance with still another aspect of the present disclosure, there is provided a method of operating a memory device, the method including: generating an operating voltage according to a first clock signal having a first cycle in a first loop; storing data representing whether an operation on each of a plurality of planes has been completed in the first loop; and generating, based on a number of pass data representing that the operation on each of the plurality of planes has been completed in the first loop, the operating voltage according to a second clock signal having a second cycle that is longer than the first cycle in a second loop.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 12 is a flowchart illustrating a memory device for generating an operating voltage according to a clock signal determined based on a number of pass data.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device capable of decreasing current consumption of a charge pump for generating a voltage, and an operating method of the memory device.

Figure 1:
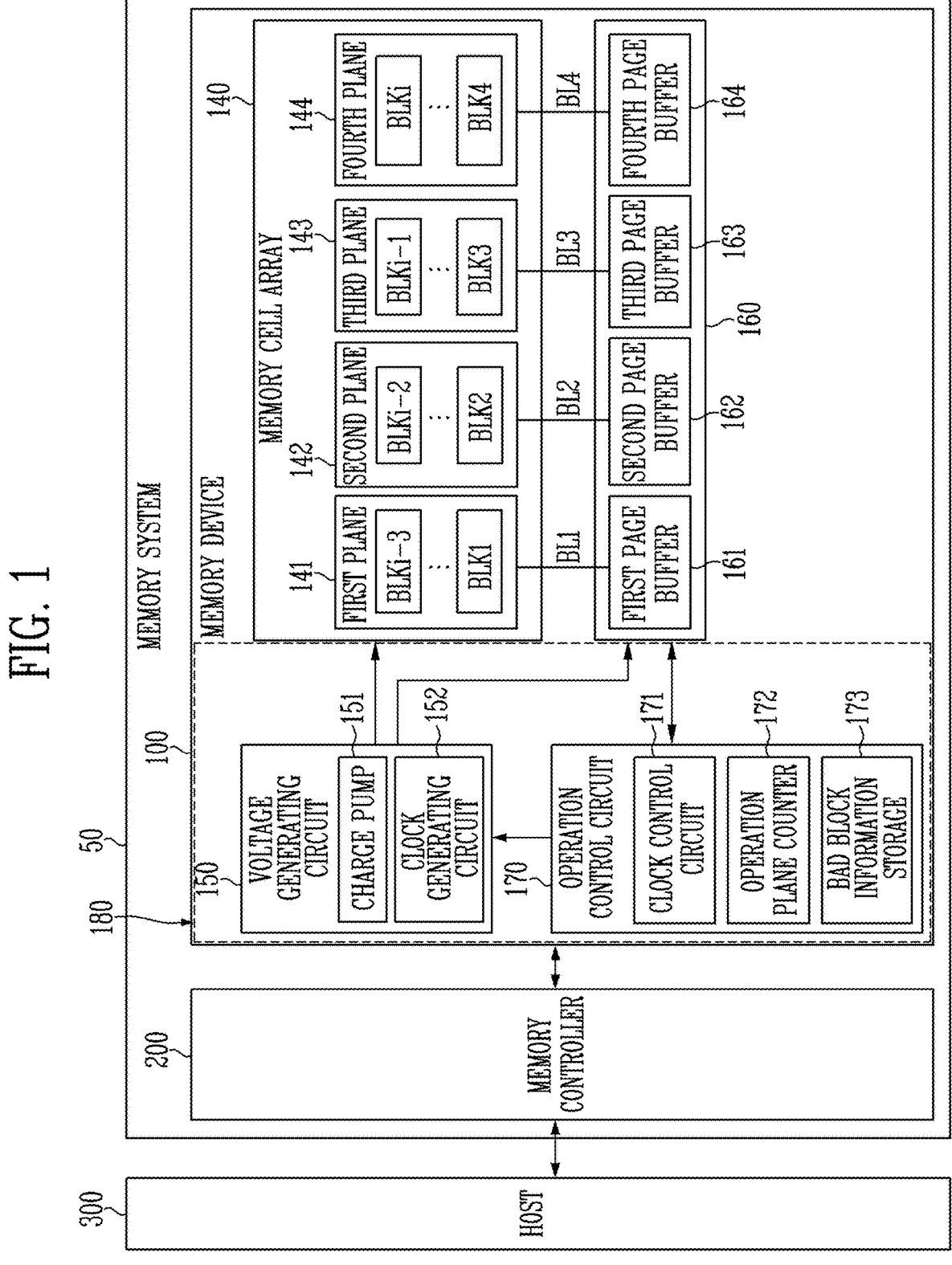
FIG. 1 is a diagram illustrating a memory system including a memory device in accordance with an embodiment of the present disclosure.

FIG. 1 is a diagram illustrating a memory system including a memory device in accordance with an embodiment of the present disclosure.

Referring to FIG. 1, the memory system 50 may include a memory device 100 and a memory controller 200. The memory system 50 may be included not only in mobile devices such as a mobile phone, a tablet PC, and a wearable device but also in various electronic devices such as a computer, a server, and an automobile. The memory system 50 may be a device which stores data under the control of a host 300 as an external device.

The memory system 50 may be manufactured as any one of various types of storage devices such as a Solid State Drive (SSD) and a Universal Flash Storage (UFS) according to a host interface as a communication scheme with the host 300. The memory system 50 may be manufactured as any one of various kinds of package types such as a System On Chip (SOC).

The memory device 100 may store data. The memory device 100 may operate under the control of the memory controller 200. In an embodiment, the memory device 100 may be a nonvolatile memory device or a volatile memory device.

The memory device 100 may receive a command and an address from the memory controller 200, and perform an operation instructed by the command on an area selected by the address. The memory device 100 may a program operation (write operation) of storing data in the area selected by the address, a read operation that reads data from the area selected by the address, or an erase operation that erases data in the area selected by the address.

The memory controller 200 may control overall operations of the memory system 50.

When power is applied to the memory system 50, the memory controller 200 may execute firmware (FW). In an embodiment, the memory controller 200 may control communication between the host 300 and the memory device 100 by executing the FW. In an embodiment, the memory controller 200 may translate a logical address of the host 300 into a physical address of the memory device 100.

The memory controller 200 may control the memory device 100 to perform a program operation, a read operation, an erase operation, or the like in response to a request of the host 300. The memory controller 200 may provide a command, a physical address or data to the memory device 100 according to a program operation, a read operation or an erase operation.

In an embodiment, the memory controller 200 may autonomously generate a command, an address, and data, regardless of any request from the host 300, and transmit the command, the address, and the data to the memory device 100. For example, the memory controller 200 may provide the memory device 100 with a command, an address, and data, which are used to perform program, read, and erase operations accompanied in performing a background operation such as wear leveling, read reclaim, or garbage collection.

In an embodiment, the memory controller 200 may control at least two memory devices 100. The memory controller 200 may control the memory devices 100 according to an interleaving scheme so as to improve operational performance. The interleaving scheme may be a scheme for controlling internal operations of at least two memory devices 100 to overlap with each other.

The host 300 may communicate with the memory system 50, using various communication schemes.

In an embodiment, the memory device 100 may include a memory cell array 140, a page buffer group 160, and a control circuit 180. The page buffer group 160 may include first to fourth page buffers 161 to 164. The control circuit may include a voltage generating circuit 150 and an operation control circuit 170.

The memory cell array 140 may include a plurality of planes. In an embodiment, when the memory cell array 140 is configured with four planes, the memory cell array 140 may include first to fourth planes 141 to 144. In another embodiment, the memory cell array 140 may include three or less or five or more planes.

The first to fourth planes 141 to 144 may include a plurality of memory blocks BLK1 to BLKi. Each of the plurality of memory blocks BLK1 to BLKi may include a plurality of memory cells. Each of the first to fourth planes 141 to 144 may independently perform a program operation, a read operation or an erase operation. In an embodiment, a first memory block BLK1 included in the first plane 141, a second memory block BLK2 included in the second plane 142, a third memory block BLK3 included in the third plane 143, and a fourth memory block BLK4 included in the fourth plane 144 may simultaneously perform a program operation that stores data. In another embodiment, the first to fourth memory blocks BLK1 to BLK4 included in different planes may simultaneously perform an erase operation that erases stored data or a read operation that reads stored data.

The first to fourth planes 141 to 144 may be connected to the first to fourth page buffers 161 to 164 through first to fourth bit lines BL1 to BL4, respectively. In FIG. 1, a case in which one page buffer is connected to one plane is described as an example. Two or more page buffers may be connected to one plane.

In a program operation, the first to fourth planes 141 to 144 may store data received from the first to fourth page buffers 161 to 164. In a verify operation or a read operation, the first to fourth page buffers 161 to 164 may store data sensed from the first to fourth planes 141 to 144, respectively. The first to fourth page buffers 161 to 164 may provide the operation control circuit 170 with the data sensed from the first to fourth planes 141 to 144. The first to fourth page buffers 161 to 164 may provide the operation control circuit 170 with pass data or fail data, representing whether an operation on each of the first to fourth planes 141 to 144 has been completed.

In an embodiment, the control circuit 180 may be configured to generate a first clock having a first period when a number of an operating plane of the plurality of planes is greater than a threshold number. Further, the control circuit 180 may be configured to generate a second clock having a second period longer than the first period when the number of the operating plane of the plurality of planes is equal to or less than the threshold number.

In an embodiment, the voltage generating circuit 150 of the control circuit 180 may be configured to generate operating voltages for driving the plurality of planes in response to at least one of the first and second clock. For example, the voltage generating circuit 150 may generate operating voltages used for a program operation, a read operation or an erase operation. In an embodiment, the operating voltages may include a program voltage, a program pass voltage, and a program verify voltage, which are used for the program operation. In an embodiment, the operating voltages may include a read voltage and a read pass voltage, which are used for the read operation. In an embodiment, the operating voltages may include an erase voltage, an erase pass voltage, and an erase verify voltage, which are used for the erase operation.

In an embodiment, the voltage generating circuit 150 may generate operating voltages and may provide the generated operating voltages to each of the first to fourth planes 141 to 144 and the page buffer group 160. Each of the first to fourth planes 141 to 144 may perform a program operation, a read operation or an erase operation according to the operating voltages.

In an embodiment, the voltage generating circuit 150 may include a charge pump 151 and a clock generating circuit 152. The clock generating circuit 152 may generate a clock signal according to a clock control signal which is generated in the operation control circuit 170. In an embodiment, the clock generating circuit 152 may generate a first clock signal having a first cycle or a second clock signal having a second cycle. For example, the first cycle is different from the second cycle. In embodiments, a period of the first cycle may be longer than a period of the second cycle. The clock generating circuit 152 may provide at least one of the first and second clock signals to the charge pump 151.

The charge pump 151 may generate at least one operating voltage by pumping a power voltage based on the clock signal.

The operation control circuit 170 may control an operation corresponding to a command provided from the memory controller 200 in response to the command. In an embodiment, the operation control circuit 170 may control the voltage generating circuit 150 to generate operating voltages used for a program operation, a read operation or an erase operation.

In an embodiment, the operation control circuit 170 may include a clock control circuit 171, an operation plane counter 172, and a bad block information storage 173.

The clock control circuit 171 may provide the clock generating circuit 152 with a clock control signal for generating a clock signal. In an embodiment, the clock control circuit 171 may provide the clock generating circuit 151 with a first clock control signal in response to the first clock signal or a second clock control signal in response to the second clock signal.

The operation plane counter 172 may generate operation plane information representing a number of planes to operate based on a number of pass data received from the first to fourth page buffers 161 to 164. In other words, the operation plane counter 172 may count a number of an operating plane among the first to fourth planes 141 to 144. The number of the operating plane may be determined by the number of the pass data of the first to fourth planes 141 to 144. In an embodiment, the operation plane counter 172 may receive the pass data representing that an operation has been completed from the page buffer 160 connected to a plane on which the operation has been completed among the first to fourth planes 141 to 144. In an embodiment, the page buffer 160 connected to the planes 144 to 144 on which the operation, for example the memory operation, has been completed may store the pass data when a threshold voltage of each of a plurality of memory cells of the plane on which the operation has been completed increases to a threshold voltage a memory cell programed to a target program state. In an embodiment, the page buffer connected to the plane on which the operation has been completed may store the pass data when the threshold voltage of each of the plurality of memory cells of the plane on which the operation has been completed decreases to a threshold voltage of a memory cell of an erase state.

In an embodiment, the operation plane counter 172 may receive fail data representing that the operation has not been completed from the page buffer 160 connected to a plane on which the operation has not been completed among the first to fourth planes 141 to 144. In an embodiment, the page buffer 160 connected to the planes 141 to 144 on which the operation has not been completed (for example, the planes 141 to 144 are in operation) may store the fail data when a threshold voltage of each of a plurality of memory cells of the plane on which the operation has not been completed does not reach the threshold voltage of the memory cell programed to the target program state. In an embodiment, the page buffer 160 connected to the plane on which the operation has not been completed may store the fail data when the threshold voltage of each of the plurality of memory cells of the plane on which the operation has not been completed does not decrease to the threshold voltage of the memory cell of the erase state.

In an embodiment, based on bad block information stored in the bad block information storage 173, the operation plane counter 172 may generate operation plane information representing a number of planes to operate. The operation plane counter 172 may provide the operation plane information to the clock control circuit 171.

In an embodiment, based on the operation plane information, the clock control circuit 171 may provide the clock generating circuit 152 with a first clock control signal corresponding to the first clock signal or a second clock control signal corresponding to the second clock signal. In an embodiment, the clock control circuit 171 may provide the clock generating circuit 152 with the first clock control signal corresponding to the first clock signal when the number of planes to operate, which is included in the operation plane information, is greater than a threshold number. In an embodiment, the clock control circuit 171 may provide the clock generating circuit 152 with the second clock control signal corresponding to the second clock signal when the number of planes to operate, which is included in the operation plane information, is equal to or less than the threshold number.

Figure 2:
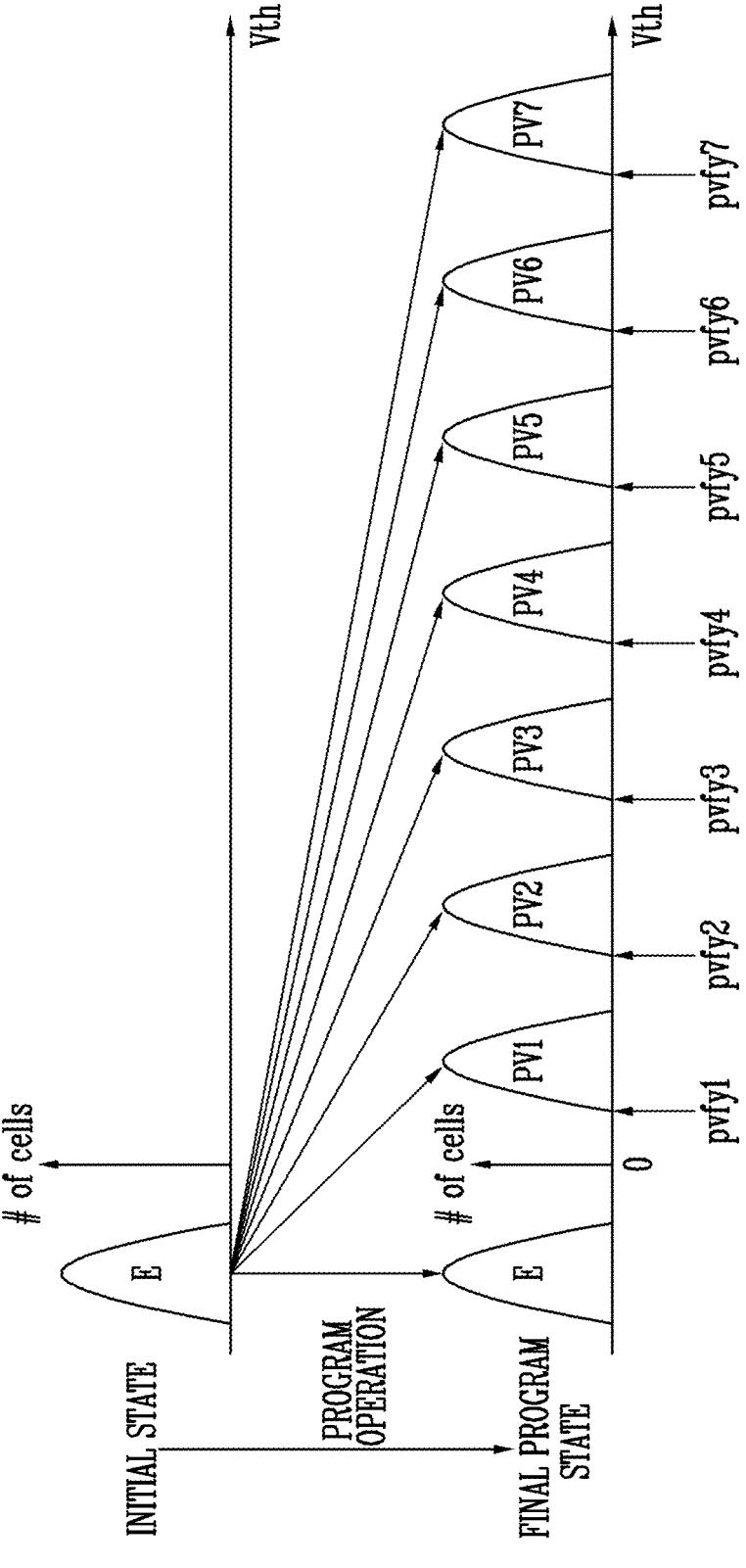
FIG. 2 is a diagram illustrating a threshold voltage distribution of memory cells according to a program operation.

FIG. 2 is a diagram illustrating a threshold voltage distribution of memory cells according to a program operation.

In FIG. 2, the horizontal axis of a graph represents threshold voltage Vth of memory cells, and the vertical axis of the graph represents number of memory cells (# of cells). In FIG. 2, a case in which one memory cell is programmed as a TLC storing three-bit data is described as an example.

Referring to FIG. 2, the threshold voltage distribution of the memory cells may be changed from an initial state to a final program state according to a program operation.

The initial state is a state in which the program operation is not performed, and the threshold voltage distribution of the memory cells may be an erase state E.

The final program state may be a threshold voltage distribution of memory cells on which the program operation is performed. The memory cells on which the program operation is performed may have a threshold voltage corresponding to any one program state among a plurality of program states. For example, when a memory cell is programmed as a TLC storing three-bit data, the plurality of program states may include the erase state E and first to seventh program states PV1 to PV7.

In an embodiment, the memory cells on which the program operation is performed may have a threshold voltage corresponding to any one program state, among the erase state E and the first to seventh program states PV1 to PV7. The threshold voltage of the memory cells in the initial state may increase to a threshold voltage corresponding to any one program state, among the erase state E and the first to seventh program states PV1 to PV7, through the program operation.

Each of the memory cells may have, as a target program state, any one program state among the erase state E and the first to seventh program states PV1 to PV7. The target program state may be determined according to data to be stored in the memory cell. Each of the memory cells may have, as the target program state, any one program state among the erase state E and the first to seventh program states PV1 to PV7, which are a plurality of program states, according to data to be stored therein. When a threshold voltage of each of the memory cells increases to a threshold voltage corresponding to the target program state, the program operation may be completed.

In an embodiment, first to seventh program verify voltages pvfy1 to pvfy7 may be voltages corresponding to the first to seventh program states PV1 to PV7, respectively. A program verify voltage may be a voltage for identifying whether a threshold voltage of a memory cell has increased to a threshold voltage corresponding to a target program state.

Figure 3:
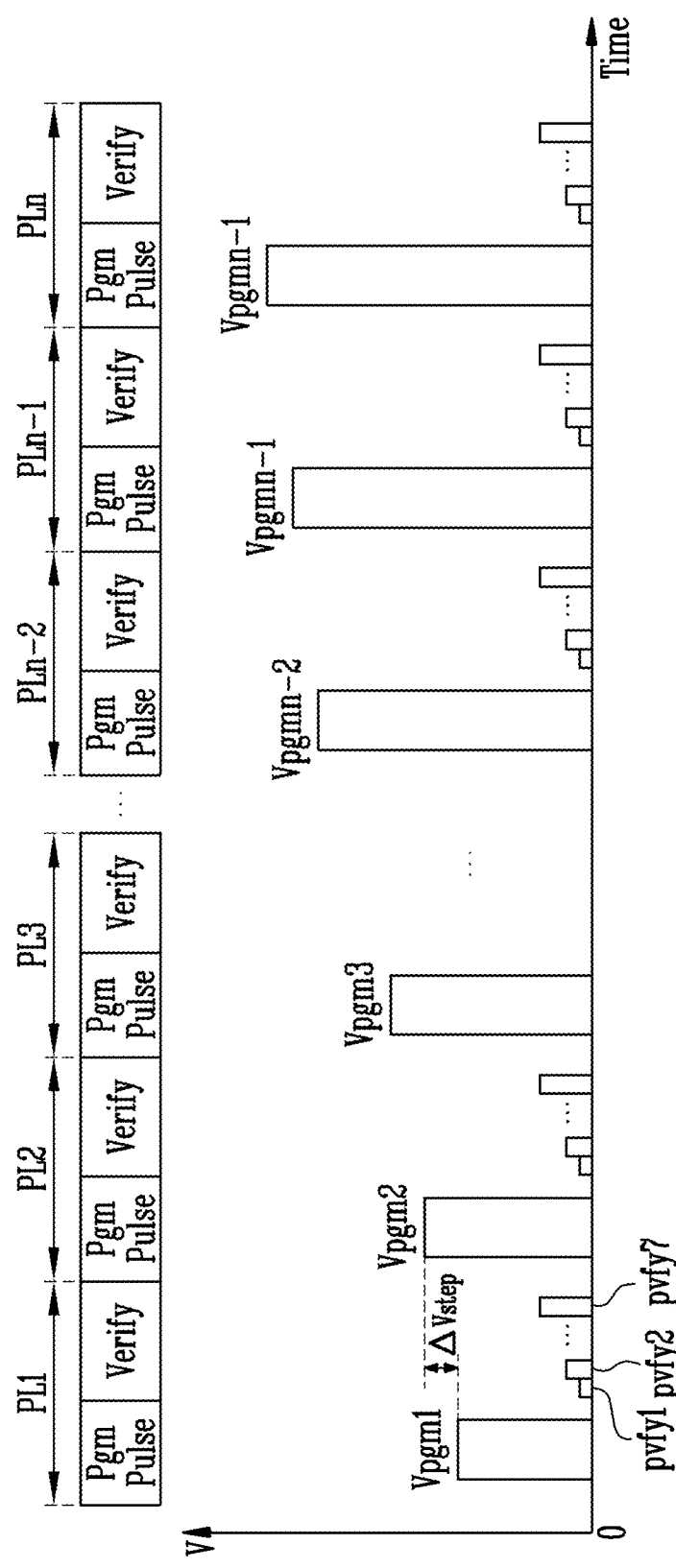
FIG. 3 is a diagram illustrating a program operation including a plurality of program loops.

FIG. 3 is a diagram illustrating a program operation including a plurality of program loops.

In FIG. 3, the horizontal axis of a graph represents time 'Time', and the vertical axis of the graph represents voltage 'V' applied to a word line. The voltage V applied to the word line may include a program voltage Vpgm and a program verify voltage pvfy.

Referring to FIG. 3, the memory device 100 may perform a program operation that includes a plurality of program loops PL1 to PLn. The memory device 100 may perform the plurality of program loops PL1 to PLn such that each of the selected memory cells connected to a selected word line has a threshold voltage corresponding to a target program state.

Each of plurality of program loops PL1 to PLn may include a program voltage apply operation Pgm Pulse and a program verify operation Verify.

The program voltage apply operation Pgm Pulse may be an operation that applies a program voltage to the selected word line to which the selected memory cells are connected. The program voltage apply operation Pgm Pulse may be an operation that increases a threshold voltage of the selected memory cells by using the program voltage.

The program verify operation Verify may be an operation that identifies a threshold voltage of memory cells, which is increased by the program voltage apply operation. The program verify operation Verify may be an operation that applies a program verify voltage pvfy to a selected word line to which selected memory cells are connected. Specifically, the program verify operation Verify may be an operation that stores sensed data to a page buffer through bit lines connected to the selected memory cells when the program verify voltage pvfy is applied to the selected word line to which the selected memory cells are connected.

In an embodiment, when a threshold voltage of the selected memory cells exceeds the program verify voltage pvfy in the program verify operation Verify, pass data representing that the program verify operation has passed may be stored in the page buffer. In an embodiment, when the threshold voltage of the selected memory cells is equal to or lower than the program verify voltage pvfy in the program verify operation Verify, fail data representing that the program verify operation has failed may be stored in the page buffer.

In an embodiment, in a first program loop LP1, the memory device 100 may apply a first program voltage Vpgm1 to the selected word line to which the selected memory cells are connected and then may apply first to seventh program verify voltages pvfy1 to pvfy7 to the selected word line. The memory device 100 may apply, to the selected word line, a program verify voltage corresponding to a target program state of memory cells, among the first to seventh program verify voltages pvfy1 to pvfy7. For example, the memory device 100 may perform a program verify operation on memory cells having the first program state as a target program state by using the first program verify voltage pvfy. Magnitudes of the program verify voltages may increase in a step-wise manner moving from the first program verify voltage pvfy1 to the seventh program verify voltage pvfy7. Specifically, among the magnitudes of the program verify voltages, the first program verify voltage pvfy1 may have the smallest magnitude, and the seventh program verify voltage pvfy7 may have the greatest magnitude. The number of program verify voltages is not limited to this embodiment.

For example, memory cells on which the program verify operation Verify based on each of the program verify voltages pvfy1 to pvfy7 passes may have a threshold voltage corresponding to a target program state. A program inhibit voltage may be applied to bit lines connected to the memory cells on which the program verify operation Verify passes.

On the other hand, memory cells on which the program verify operation Verify based on each of the program verify voltages pvfy1 to pvfy7 fails might not have the threshold voltage corresponding to the target program state. A second program loop PL2 may be performed on the memory cells on which the program verify operation Verify fails. A program allow voltage may be applied to bit lines connected to the memory cells on which the program verify operation Verify fails.

In the second program loop PL2, the memory device 100 may apply a second program voltage Vpgm2, which is higher than the first program voltage Vpgm1 by a step voltage ΔVstep, to the selected word line to which the selected memory cells are connected. After that, the memory device 100 may perform a program verify operation Verify in the second program loop PL2, which is identical to the program verify operation Verify in the first program loop PL1.

After that, the memory device 100 may perform, by a predetermined number of times, a subsequent program loop that is identical to the second program loop PL2.

In an embodiment, when the program operation is not completed within the predetermined number of program loops, the program operation may fail. When the program operation is completed within the predetermined number of program loops, the program operation may pass. When all program verify operations Verify on the selected memory cells pass, the program operation may be completed. When the program verify operation Verify on all the selected memory cells passes, the next program loop might not be performed.

In an embodiment, a program voltage may be determined according to an Incremental Step Pulse Programming (ISPP) method. The level of the program voltage may increase or decrease in a step-wise manner as the program loops PL1 to PLn are repeated. The number of times program voltages used for each of the program loops are applied, a voltage level of the program voltages, a time at which the program voltage are applied, and the like may vary under the control of the memory controller 200.

Figure 4:
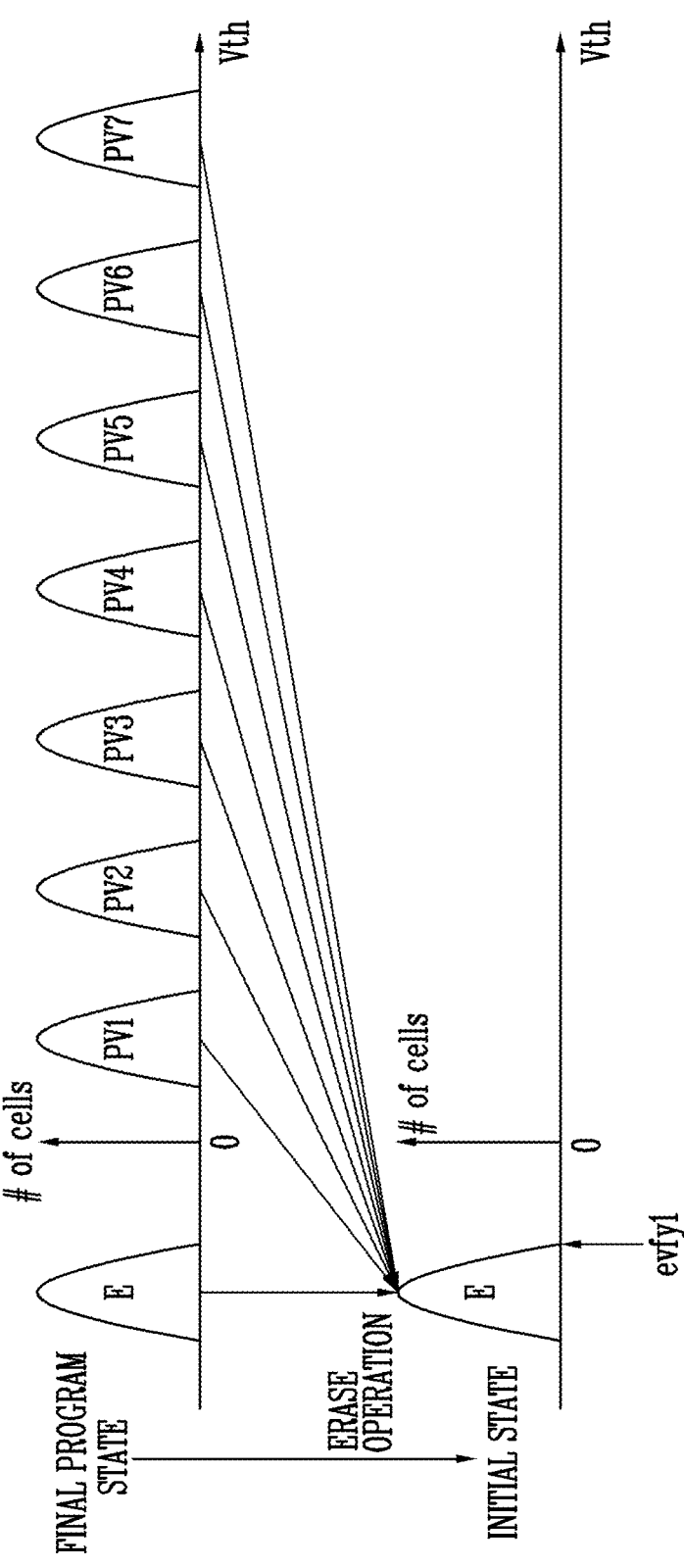
FIG. 4 is a diagram illustrating a threshold voltage distribution of memory cells according to an erase operation.

FIG. 4 is a diagram illustrating a threshold voltage distribution of memory cells according to an erase operation.

In FIG. 4, the horizontal axis of a graph represents threshold voltage Vth of memory cells, and the vertical axis of the graph represents number of memory cells (# of cells).

Referring to FIG. 4, memory cells on which the program operation is completed may have a threshold voltage distribution corresponding to a final program state. After that, the memory device 100 may perform an erase operation on the memory cells on which the program operation is completed. The threshold voltage distribution of the memory cells may be changed from the final program state to an initial state by the erase operation. The erase operation may be an operation in which a threshold voltage of the memory cells decreases to a threshold voltage corresponding to the erase state E. Specifically, through the erase operation, memory cells having a threshold voltage corresponding to each of the erase state E and the first to seventh program states PV1 to PV7 may have a threshold voltage corresponding to the erase state.

In an embodiment, an erase verify voltage evfy1 may be a voltage corresponding to the erase state E. The erase verify voltage evfy1 may be a voltage for identifying whether the threshold voltage of the memory cells has decreased to the threshold voltage corresponding to the erase state E.

Figure 5:
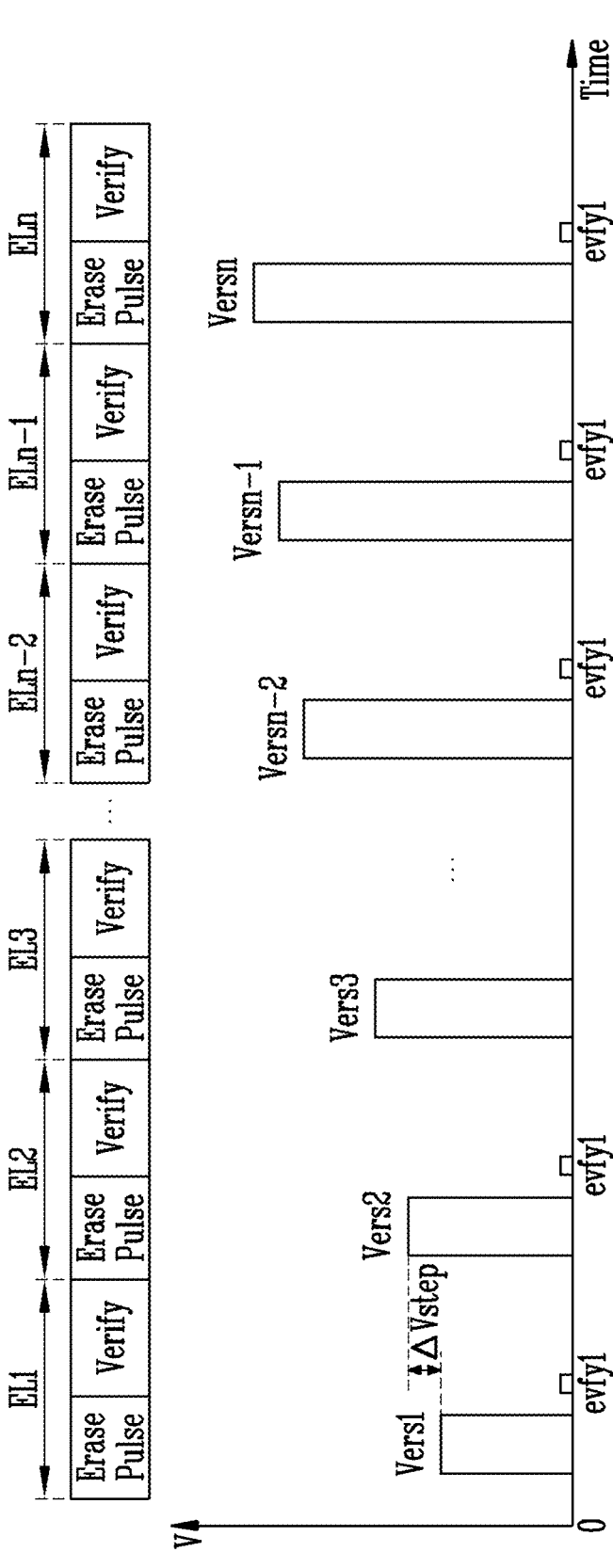
FIG. 5 is a diagram illustrating an erase operation including a plurality of erase loops.

FIG. 5 is a diagram illustrating an erase operation including a plurality of erase loops.

In FIG. 5, the horizontal axis of a graph represents time 'Time', and the vertical axis of the graph represents voltage 'V' applied to a word line, a common source line or a bit line. For example, an erase voltage Vers may be applied to the common source line or the bit line, and an erase verify voltage evfy may be applied to the word line.

Referring to FIG. 5, the memory device 100 may perform an erase operation. The erase operation may include a plurality of erase loops EL1 to ELn. The memory device 100 may perform the plurality of erase loops EL1 to ELn such that each of memory cells has a threshold voltage corresponding to the erase state.

Each of the plurality of erase loops EL1 to ELn may include an erase voltage apply operation Erase Pulse and an erase verify operation Verify.

The erase voltage apply operation Erase Pulse may be an operation that applies an erase voltage Vers to a common source line or bit lines, connected to memory cells. The erase verify operation Verify may be an operation that identifies a threshold voltage of the memory cells, which is decreased by the erase voltage apply operation Erase Pulse. The erase verify operation Verify may be an operation that stores sensed data in a page buffer through the bit lines connected to the memory cells when an erase verify voltage evfy1 is applied to a word line connected to the memory cells.

In an embodiment, when the threshold voltage of the memory cells exceeds the erase verify voltage evfy1 in the erase verify operation Verify, fail data representing that the erase verify operation Verify has failed may be stored in the page buffer. In an embodiment, when the threshold voltage of the memory cells is equal to or lower than the erase verify voltage evfy1 in the erase verify operation Verify, pass data representing that the erase verify operation Verify has passed may be stored in the page buffer.

In an embodiment, in a first erase loop EL1, the memory device 100 may apply a first erase voltage Vers1 to the common source line or the bit lines and then may apply an erase verify voltage evfy1 to the word line. When the erase verify operation Verify passes, it may be decided that the memory cells have a threshold voltage corresponding to the erase state E. When the erase verify operation Verify fails, it may be decided that the memory cells do not have the threshold voltage corresponding to the erase state E.

When the erase verify operation Verify in the first erase loop EL1 fails, the memory device may perform a second erase loop EL2. In an erase voltage apply operation Erase Pulse in the second erase loop EL2, the memory device 100 may apply a second erase voltage Vers2, which is higher than the first erase voltage Vers1 by a step voltage ΔVstep, to the common source line or the bit lines. In an erase verify operation Verify in the second erase loop EL2, the memory device 100 may identify the threshold voltage of the memory cells by using the erase verify voltage evfy1.

After that, when the erase verify operation Verify of the second erase loop EL2 fails, the memory device 100 may perform a subsequent erase loop that is identical to the second erase loop EL2.

In an embodiment, when the erase operation is completed within a predetermined number of erase loops, the erase operation may pass. When a threshold voltage of each of the memory cells is decreased to the threshold voltage corresponding to the erase state E, the erase operation may be completed. When the erase verify operation Verify on the memory cells passes, the erase operation may be completed. In an embodiment, in the second erase loop EL2, when the erase verify operation Verify on the memory cells passes, the erase operation may be completed. In an embodiment, when the erase operation is not completed within the predetermined number of erase loops, the erase operation may fail.

Figure 6:
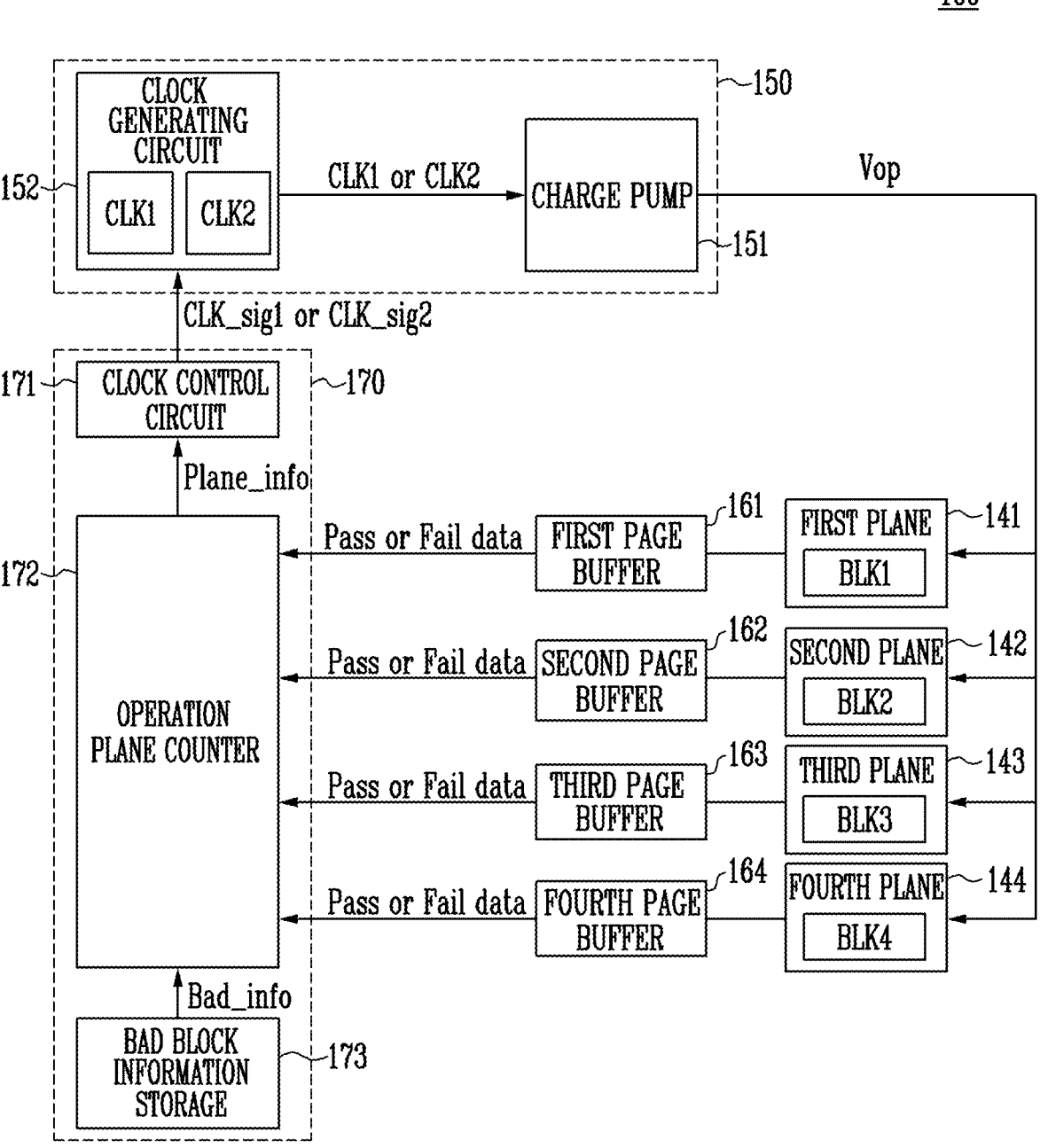
FIG. 6 is a diagram illustrating a memory device for generating an operating voltage according to a clock signal determined based on operation plane information.

FIG. 6 is a diagram illustrating a memory device for generating an operating voltage according to a clock signal determined based on operation plane information.

FIG. 6 will be described with reference to FIG. 1. Referring to FIG. 6, the memory device 100 may include first to fourth planes 141 to 144, a voltage generating circuit 150, first to fourth page buffers 161 to 164, and an operation control circuit 170. The voltage generating circuit 150 may include a charge pump 151 and a clock generating circuit 152. The operation control circuit 170 may include a clock control circuit 171, an operation plane counter 172, and a bad block information storage 173.

The memory device 100 may perform an operation corresponding to a command received from the memory controller 200 in response to the command. The operation corresponding to the command may be a program operation, a read operation, or an erase operation.

In an embodiment, the clock control circuit 171 may provide the clock generating circuit 151 with a first clock control signal CLK_sig1 for performing the operation corresponding to the command. The clock generating circuit 152 may generate a first clock signal CLK1 having a first cycle in response to the first clock control signal CLK_sig1. The clock generating circuit 152 may provide the first clock signal CLK1 to the charge pump 151.

The charge pump 151 may perform a pump operation that generates operating voltages Vop in response to the first clock signal CLK1. The charge pump 151 may provide the operating voltages Vop to each of the first to fourth planes 141 to 144.

Each of the first to fourth planes 141 to 144 may perform the operation corresponding to the command by using the operating voltages Vop. In an embodiment, first to fourth memory blocks BLK1 to BLK4, respectively included in the first to fourth planes 141 to 144, may perform a program operation, a read operation, or an erase operation.

After the operation on each of the first to fourth planes 141 to 144 is performed, pass data or fail data, which represents whether the operation on each of the first to fourth planes 141 to 144 has been completed may be stored in each of the first to fourth page buffers 161 to 164 respectively connected to the first to fourth planes 141 to 144. For example, when the operation on the first plane 141 is completed, pass data may be stored in the first page buffer 161. When the operation on the first plane 141 is not completed, fail data may be stored in the first page buffer 161.

In an embodiment, when a threshold voltage of each of a plurality of memory cells included in the first memory block BLK1 of the first plane 141 increases to a threshold voltage corresponding to a target program state, the pass data may be stored in the first page buffer 161. In an embodiment, when a program verify operation on each of the plurality of memory cells included in the first memory block BLK1 of the first plane 141 passes, the pass data may be stored in the first page buffer 161.

In an embodiment, when the threshold voltage of each of the plurality of memory cells included in the first memory block BLK1 of the first plane 141 does not reach the threshold voltage corresponding to the target program state, the fail data may be stored in the first page buffer 161. In an embodiment, when the program verify operation on each of the plurality of memory cells included in the first memory block BLK1 of the first plane 141 fails, the fail data may be stored in the first page buffer 161.

In an embodiment, when the threshold voltage of each of the plurality of memory cells included in the first memory block BLK1 of the first plane 141 decreases to a threshold voltage corresponding to the erase state, the pass data may be stored in the first page buffer 161. In an embodiment, when an erase verify operation on the plurality of memory cells included in the first memory block BLK1 of the first plane 141 passes, the pass data may be stored in the first page buffer 161.

In an embodiment, when the threshold voltage of each of the plurality of memory cells included in the first memory block BLK1 of the first plane 141 does not decrease to the threshold voltage corresponding to the erase state, the fail data may be stored in the first page buffer 161. In an embodiment, when the erase verify operation on the plurality of memory cells included in the first memory block BLK1 of the first plane 141 fails, the fail data may be stored in the first page buffer 161.

Identically to the operation on the first memory block BLK1 of the first plane 141, pass data or fail data, which represents whether an operation on each of the second to fourth memory blocks BLK2 to BLK4, respectively included in the second to fourth planes 142 to 144, has been completed, may be stored in each of the second to fourth page buffers 162 to 164.

Pass data or the fail data, which is stored in each of the first to fourth page buffers 161 to 164, may be provided to the operation plane counter 172.

Based on a number of pass data received from the first to fourth page buffers 161 to 164, the operation plane counter 172 may generate operation plane information Plane info representing a number of planes to operate. In an embodiment, when the operation plane counter 172 receives pass data from the first page buffer 161 and receive fail data from the second to fourth page buffers 162 to 164, the second to fourth planes 142 to 144, except the first plane 141, may be the planes to operate, and therefore, the operation plane counter 172 may generate operation plane information Plane info representing that the number of planes to operate is 3.

In an embodiment, the operation plane counter 172 may generate operation plane information Plane_info based on bad block information Bad_info stored in the bad block information storage 173. In an embodiment, when the operation plane counter 172 receives bad block information Bad_info representing that the first memory block BLK1 is a bad block, the second to fourth planes 142 to 144, except the first plane 141, may be the planes to operate, and therefore, the operation plane counter 172 may generate operation plane information Plane_info representing that the number of planes to operate is 3. The operation plane counter 172 may provide the operation plane information Plane_info to the clock control circuit 171.

The clock control circuit 171 may provide the first clock control signal CLK_sig1 or a second clock control signal CLK_sig2 to the clock generating circuit 152 based on a result obtained by comparing information regarding the number of planes to operate, which is included in the operation plane information Plane_info, with a threshold number. In an embodiment, when the number of planes to operate is greater than the threshold number, the clock control circuit 152 may provide the clock generating circuit 152 with the first clock control signal CLK_sig1 corresponding to the first clock signal CLK1. The clock generating circuit 152 may provide the charge pump 151 with the first clock signal CLK1 having the first cycle in response to the first clock control signal CLK_sig1.

In an embodiment, when the number of planes to operate is equal to or less than the threshold number, the clock control circuit 171 may provide the clock generating circuit 152 with the second clock control signal CLK_sig2 corresponding to a second clock signal CLK2. The clock generating circuit 152 may provide the charge pump 151 with the second clock signal CLK2 having a second cycle, which is longer than the first cycle, in response to the second clock control signal CLK_sig2.

The charge pump 151 may perform the pump operation that generates the operating voltages Vop in response to the first clock signal CLK1 or the second clock signal CLK2. The charge pump 151 may provide the operating voltages Vop to the remaining planes, among the first to fourth planes 141 to 144, except a plane on which the operation has been completed. In an embodiment, when the pass data is stored in the first page buffer 161, the charge pump 151 may provide the operating voltages Vop to each of the second to fourth planes 142 to 144, except the first plane 141. The second to fourth planes 142 to 144 may perform an operation corresponding to a command by using the operating voltages Vop.

In an embodiment, the memory device 100 may store pass data or fail data, which represents whether the operation on each of the first to fourth planes 141 to 144 has been completed. The memory device 100 may change the cycle of a clock signal from the first cycle to the second cycle based on the number of pass data stored in the first to fourth planes 141 to 144. When the number of pass data stored in the first to fourth page buffers 161 to 164 is equal to or greater than the threshold value, the memory device 100 may generate operating voltages according to the clock signal having the second cycle. When the number of pass data stored in first to fourth page buffers 161 to 164 is less than the threshold value, the memory device 100 may generate operating voltages according to the clock signal having the first cycle.

In an embodiment, when the number of planes on which operations have been completed is greater than the threshold number, the memory device may generate the operating voltages Vop according to the clock signal having the second cycle so that an amount of current consumed in generating the operating voltages Vop can be reduced.

Figure 7:
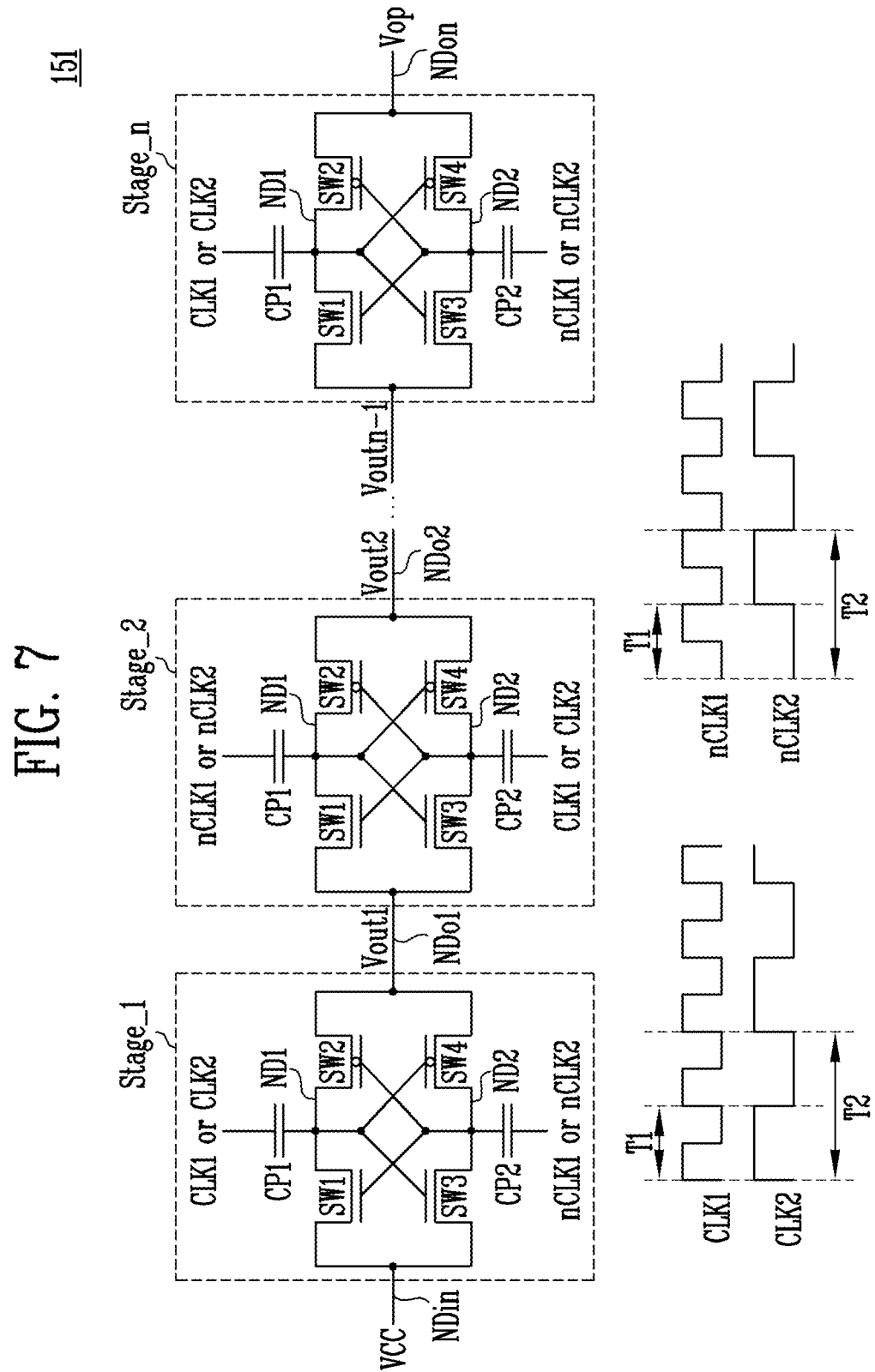
FIG. 7 is a diagram illustrating a charge pump.

FIG. 7 is a diagram illustrating a charge pump.

Referring to FIG. 7, the charge pump 151 may receive a first clock signal CLK1 and a second clock signal CLK2 from the clock generating circuit 152. The first clock signal CLK1 may be a clock signal having a first cycle T1, and the second clock signal CLK2 may be a clock signal having a second cycle T2, which is longer than the first cycle T1.

The charge pump 151 may include first to nth stages Stage_1 to Stage_n, connected in series between an input node NDin and an nth output node NDon. Each of the first to nth stages Stage_1 to Stage_n may perform a pump operation that generates an operating voltage Vop in response to a cock signal and an inverted clock signal, which are received from the clock generating circuit 152.

In an embodiment, the first stage Stage_1 may include first and second switches SW1 and SW2 and third and fourth switches SW3 and SW4, which are connected between the input node NDin and the second stage Stage_2. A power voltage VCC may be applied to the input node NDin.

The first and second switches SW1 and SW2 and the third and fourth switches SW3 and SW4 may be connected in parallel. The first switch SW1 and the second switch SW2 may be connected in series. The third switch SW3 and the fourth switch SW4 may be connected in series. Each of the first switch SW1 and the third switch SW3 may be an NMOS transistor. Each of the second switch SW2 and the fourth switch SW4 may be a PMOS transistor.

A first capacitor CP1 may be connected to a first node ND1 between the first switch SW1 and the second switch SW2. The first clock signal CLK1 or the second clock signal CLK2 may be applied to the first capacitor CP1. A second capacitor CP2 may be connected to a second node ND2 between the third switch SW3 and the fourth switch SW4.

An inverted first clock signal nCLK1 or an inverted second clock signal nCLK2 may be applied to the second capacitor CP2.

In an embodiment, when the first clock signal CLK1 or the second clock signal CLK2 is at a logic high, the inverted first clock signal nCLK1 or the inverted second clock signal nCLK2 may be at logic low. When the first clock signal CLK1 or the second clock signal CLK2 is at a logic high, a potential of the first node ND1 may become high. When the potential of the first node ND1 is high, the third switch SW3 connected to the first node ND1 may be turned on, and the fourth switch SW4 may be turned off. The power voltage VCC applied to the input node NDin may be transferred to the second capacitor CP2 as the third switch SW3 is turned on.

When the inverted first clock signal nCLK1 or the inverted second clock signal nCLK2 is at a logic low, a potential of the second node ND2 may become low. When the potential of the second node ND2 is low, the first switch SW1 connected to the second node ND2 may be turned off, and the second switch SW2 may be turned on. Charges charged in the first capacitor CP1 may be transferred to a first output node NDo1.

In an embodiment, when the first clock signal CLK1 or the second clock signal CLK2 is at a logic low, the inverted first clock signal nCLK1 or the inverted second clock signal nCLK2 may be at a logic high. When the first clock signal CLK1 or the second clock signal CLK2 is at a logic low, the potential of the first node ND1 may become low. When the potential of the first node ND1 is low, the third switch SW3 connected to the first node ND1 may be turned off, and the fourth switch SW4 may be turned on. Charges charged in the second capacitor CP2 may be transferred to the first output node NDo1 as the fourth switch SW4 is turned on.

When the inverted first clock signal nCLK1 or the inverted second clock signal nCLK2 is at a logic high, the potential of the second node ND2 may become high. When the potential of the second node ND2 is high, the first switch SW1 connected to the second node ND2 may be turned on, and the second switch SW2 may be turned off. The power voltage VCC applied to the input node NDin may be transferred to the first capacitor CP1 as the first switch SW1 is turned on.

In an embodiment, the first stage Stage_1 may perform a pump operation according to the first clock signal CLK1 or the second clock signal CLK2 and the inverted first clock signal nCLK1 or the inverted second clock signal nCLK2 and may output, to the first output node NDo1, a first output voltage Vout1, which is higher than the power voltage VCC applied to the input node NDin.

The second to nth stages Stage_2 to Stage_n may be implemented in the same manner as the first stage Stage_1. In an embodiment, the second stage Stage_2 may output a second output voltage Vout2, which is higher than the first output voltage Vout1, according to the first clock signal CLK1 or the second clock signal CLK2 and the inverted first clock signal nCLK1 or the inverted second clock signal nCLK2. The nth stages Stage_n may output an operating voltage Vop, which is higher than an (n−1)th output voltage Voutn−1, according to the first clock signal CLK1 or the second clock signal CLK2 and the inverted first clock signal nCLK1 or the inverted second clock signal nCLK2.

Figure 8:
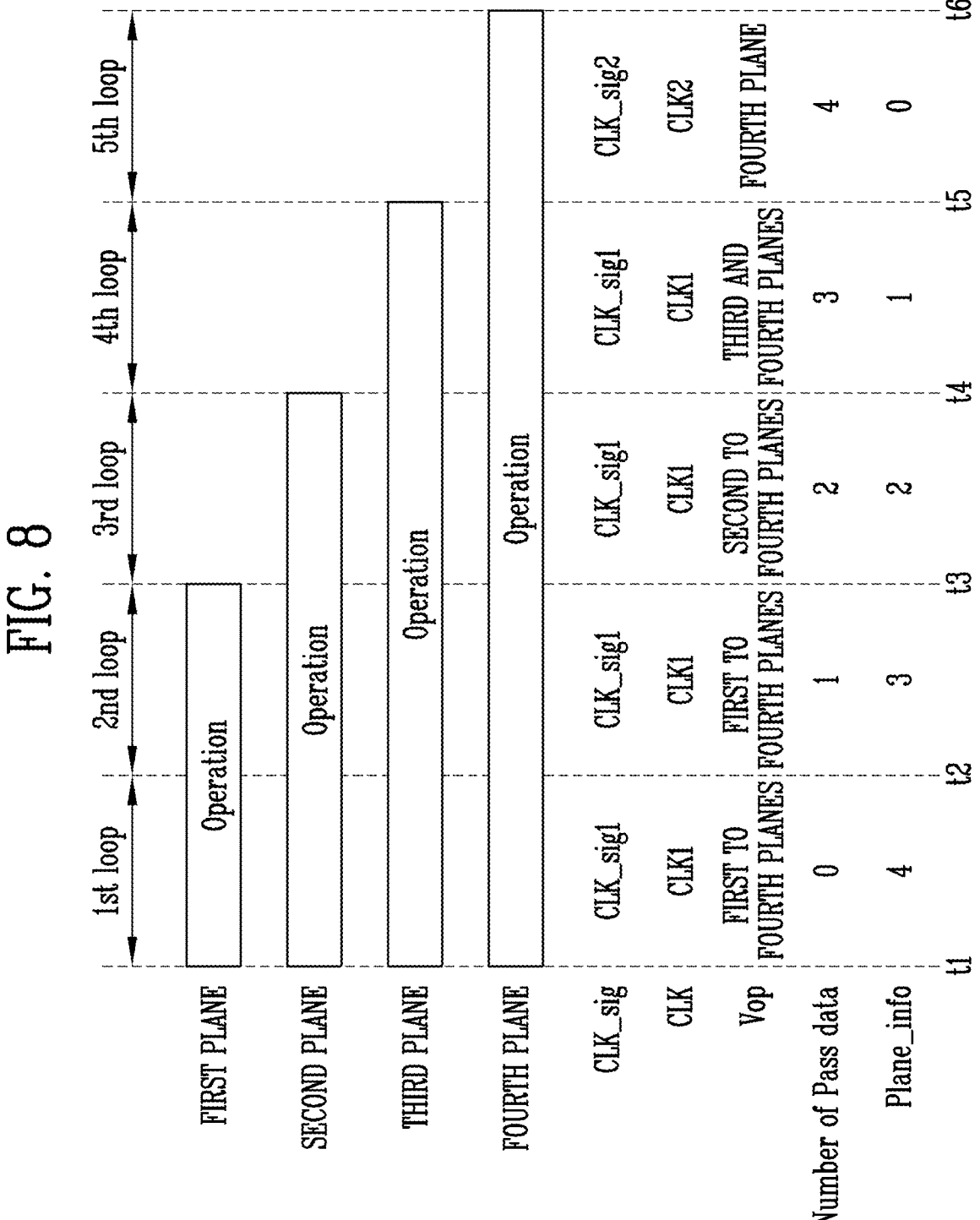
FIG. 8 is a diagram illustrating a memory device for changing a cycle of a clock signal according to operation plane information in a plurality of loops.

FIG. 8 is a diagram illustrating a memory device for changing a cycle of a clock signal according to operation plane information in a plurality of loops.

FIG. 8 will be described with reference to FIG. 6. Referring to FIG. 8, each of the first to fourth planes 141 to 144 may perform an operation corresponding to a command received from the memory controller 200. In an embodiment, the operation may include first to fifth loops 1st loop to 5th loop. The first to fifth loops 1st loop to 5th loop may be program loops or erase loops.

In an embodiment, the first to fourth planes 141 to 144 may perform the first loop 1st loop. In the first loop 1st loop, the clock control circuit 171 may output a first clock control signal CLK_sig1. In the first loop 1st loop, the clock generating circuit 152 may output a first clock signal CLK1 having a first cycle in response to the first clock control signal CLK_sig1. The charge pump 151 may generate operating voltages Vop in response to the first clock signal CLK1. The charge pump 151 may provide the operating voltages Vop to each of the first to fourth planes 141 to 144. In the first loop 1st loop, each of the first to fourth planes 141 to 144 may perform the operation corresponding to the command by using the operating voltages Vop.

In an embodiment, in the first loop 1st loop, the operation on each of the first to fourth planes 141 to 144 might not be completed. For example, in the first loop 1st loop, a verify operation on each of the first to fourth planes 141 to 144 may fail. The verify operation may be a program verify operation or an erase verify operation. In the first loop 1st loop, fail data may be stored in the first to fourth page buffers 161 to 164 respectively connected to the first to fourth planes 141 to 144. The operation plane counter 172 may receive the fail data from the first to fourth page buffers 161 to 164. That is, the number of pass data received from the first to fourth page buffers 161 to 164 may be 0. Since the number of pass data received in the first loop 1st loop is 0, the operation plane counter 172 may generate operation plane information Plane_info representing that the number of planes to operate in the second loop 2nd loop is 4.

In the second loop 2nd loop, the clock control signal 171 may output the first clock control signal CLK_sig1 or a second clock control signal CLK_sig2 based on a result obtained by comparing information regarding the number of planes to operate, which is included in the operation plane information Plane_info, with a threshold number. In FIG. 8, a case in which the threshold number is 1 will be described as an example. In the second loop 2nd loop, since 4 as the number of planes to operate is greater than 1 as the threshold number, the clock control circuit 171 may output the first clock control signal CLK_sig1. The clock generating circuit 152 may output the first clock signal CLK1 in response to the first clock control signal CLK_sig1. The charge pump 151 may generate operating voltages Vop in response to the first clock signal CLK1 and may provide the generated operating voltages Vop to each of the first to fourth planes 141 to 144.

In an embodiment, in the second loop 2nd loop, the operation on the first plane 141 may be completed, and the operation on each of the second to fourth planes 141 to 144 might not be completed. In the second loop 2nd loop, pass data may be stored in the first page buffer 161 connected to the first plane 141, and fail data may be stored in the second to fourth page buffers 162 to 164 connected to the second to fourth planes 142 to 144. In the second loop 2nd loop, the operation plane counter 172 may receive one pass data from the first to fourth page buffers 161 to 164. Based on the one pass data, the operation plane counter 172 may generate operation plane information Plane_info representing that the number of planes to operate in the third loop 3rd loop is 3.

In the third loop 3rd loop, since 3 as the number of planes to operate is greater than 1 as the threshold number, the clock control circuit 171 may output the first clock control signal CLK_sig1. The clock generating circuit 152 may output the first clock signal CLK1 in response to the first clock control signal CLK_sig1. The charge pump 151 may generate operating voltages Vop in response to the first clock signal CLK1 and may provide the generated operating voltages Vop to each of the second to fourth planes 142 to 144.

In an embodiment, in the third loop 3rd loop, the operation on the second plane 142 may be completed, and the operation on each of the third and fourth planes 143 and 144 might not be completed. In the third loop 3rd loop, pass data may be stored in the second page buffer 162 connected to the second plane 142, and fail data may be stored in the third and fourth page buffers 163 and 164 connected to the third and fourth planes 143 and 144. In the third loop 3rd loop, the operation plane counter 172 may receive two pass data from the first to fourth page buffers 161 to 164. Based on the two pass data, the operation plane counter 172 may generate operation plane information Plane_info representing that the number of planes to operate in the fourth loop 4th loop is 2.

In the fourth loop 4th loop, since 2 as the number of planes to operate is greater than 1 as the threshold number, the clock control circuit 171 may output the first clock control signal CLK_sig1. The clock generating circuit 152 may output the first clock signal CLK1 in response to the first clock control signal CLK_sig1. The charge pump 151 may generate operating voltages Vop in response to the first clock signal CLK1 and may provide the generated operating voltages Vop to each of the third and fourth planes 143 and 144.

In an embodiment, in the fourth loop 4th loop, the operation on the third plane 143 may be completed, and the operation on the fourth plane 144 might not be completed. In the fourth loop 4th loop, pass data may be stored in the third page buffer 163 connected to the third plane 143, and fail data may be stored in the fourth paged buffer 164 connected to the fourth plane 144. In the fourth loop 4th loop, the operation plane counter 172 may receive three pass data from the first to fourth page buffers 161 to 164. Based on the three pass data, the operation plane counter 172 may generate operation plane information Plane_info representing that the number of planes to operate in the fifth loop 5th loop is 1.

In the fifth loop 5th loop, when the number of planes to operate is equal to or less than the threshold number, the clock control circuit 171 may output the second clock control signal CLK_sig2. Since 1 as the number of planes to operate is equal to 1 as the threshold number, the clock control circuit 171 may output the second clock control signal CLK_sig2. The clock generating circuit 152 may include a second clock signal CLK2 having a second cycle, which is longer than the first cycle, in response to the second clock control signal CLK_sig2. The charge pump 151 may generate operating voltages Vop in response to the second clock signal CLK and may provide the generated operating voltages Vop to the fourth plane 144.

In an embodiment, in the fifth loop 5th loop, the operation on the fourth plane 144 may be completed. In the fifth loop 5th loop, pass data may be stored in the fourth page buffer 164 connected to the fourth plane 144. That is, pass data may be stored in all the first to fourth page buffers 161 to 164. Based on the four pass data received from the first to fourth page buffers 161 to 164, the operation plane counter 172 may generate operation plane information Plane_info representing that the number of planes to operate is 0. Since the operation on each of the first to fourth planes 141 to 144 has been completed, a next loop might not be performed.

Figure 9:
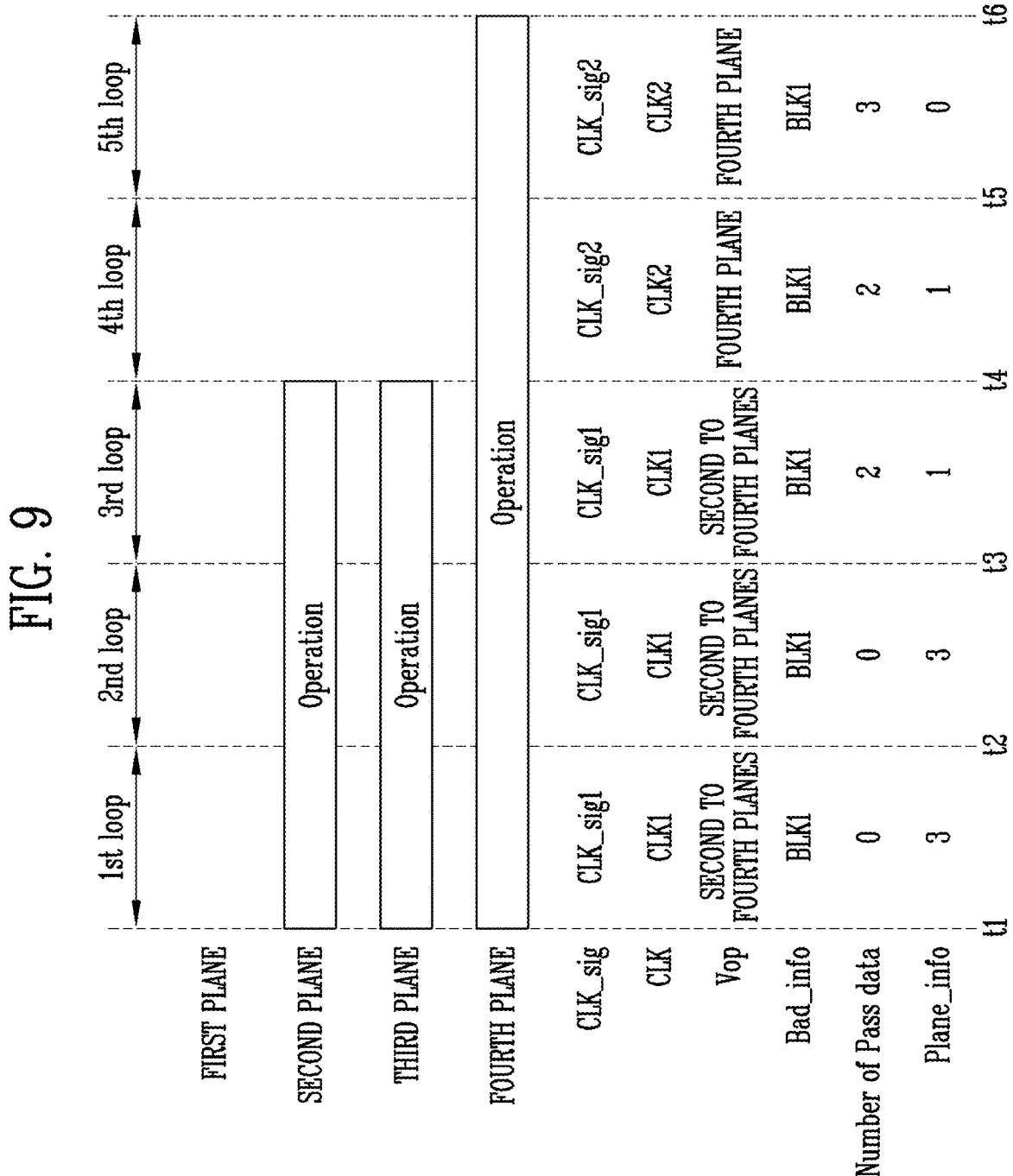
FIG. 9 is a diagram illustrating a memory device for changing a cycle of a clock signal according to operation plane information and bad block information in a plurality of loops.

FIG. 9 is a diagram illustrating a memory device for changing a cycle of a clock signal according to operation plane information and bad block information in a plurality of loops.

FIG. 9 will be described with reference to FIG. 6. In FIG. 9, descriptions of portions overlapping with those shown in FIG. 8 will be omitted. Referring to FIG. 9, the operation plane counter 172 may generate operation plane information Plane_info based on bad block information Bad_info received from the bad block information storage 173 and a number of pass data.

In an embodiment, in the first loop 1st loop, the operation plane counter 172 may receive bad block information Bad_info representing the first memory block BLK1 included in the first plane 141 is a bad block. Based on the bad block information Bad_info, the operation plane counter 172 may generate operation plane information Plane_info representing that the second to fourth planes 142 to 144, except the first plane 141, among the first to fourth planes 141 to 144, are planes to operate. The operation plane counter 172 may generate operation plane information Plane_info representing the number of planes to operate is 3.

In the first loop 1st loop, since 3 as the number of planes to operate is larger than 1 as the threshold number, the first clock control circuit 171 may output the first clock control signal CLK_sig1. In the first loop 1st loop, the clock generating circuit 152 may output the first clock signal CLK1 having the first cycle in response to the first clock control signal CLK_sig1. In the first loop 1st loop, the charge pump 151 may generate operating voltages Vop in response to the first clock signal CLK1 and may provide the generated operating voltages Vop to each of the second to fourth planes 142 to 144. The first plane 141 may include the first memory block BLK1 as a bad block, and therefore, any operation might not be performed.

In an embodiment, in the first loop 1st loop, the operation on each of the second to fourth planes 142 to 144 might not be completed. In the first loop 1st loop, fail data may be stored in the second to fourth page buffers 162 to 164 respectively connected to the second to fourth planes 142 to 144. Based on three fail data received from the second to fourth page buffers 162 to 164 and the bad block information Bad_info, the operation plane counter 172 may generate operation plane information Plane_info representing that the number of planes to operate in the second loop 2nd loop is 3.

After that, in the second loop 2nd loop, the operation on each of the second to fourth planes 142 to 144 might not be completed. Based on the three fail data received from the second to fourth page buffers 162 to 164 and bad block information Bad_info, the operation plane counter 172 may generate operation plane information Plane_info representing that the number of planes to operate in the third loop 3rd loop is 3.

After that, in the third loop 3rd loop, the operation on each of the second and third planes 142 and 143 may be completed, and the operation on the fourth plane 144 might not be completed. Pass data may be stored in the second and third page buffers 162 and 163 respectively connected to the second and third planes 142 and 143. Based on two pass data received from the second to fourth page buffers 162 to 164 and bad block information Bad_info, the operation plane counter 172 may generate operation plane information Plane_info representing that the number of planes to operate in the fourth loop 4th loop is 1.

In the fourth loop 4th loop, based on a result obtained by comparing the number of planes to operate with the threshold number, the clock control circuit 171 may output the first clock control signal CLK_sig1 or the second clock control signal CLK_sig2. In the fourth loop 4th loop, since 1 as the number of planes to operate is equal to 1 as the threshold number, the clock control circuit 171 may output the second clock control signal CLK_sig2. The clock generating circuit 152 may output the second clock signal CLK2 having the second cycle, which is longer than the first cycle, in response to the second clock control signal CLK_sign2. In the fourth loop 4th loop, the charge pump 151 may generate operating voltages Vop in response to the second clock signal CLK2 and may provide the generated operating voltages Vop to the fourth plane 144.

After that, in the fifth loop 5th loop, when the operation on the fourth plane 144 is completed, pass data may be stored in the fourth page buffer 164 connected to the fourth plane 144. In the fifth loop 5th loop, when the operation on the fourth plane 144 is completed, a next loop might not be performed.

Figure 10:
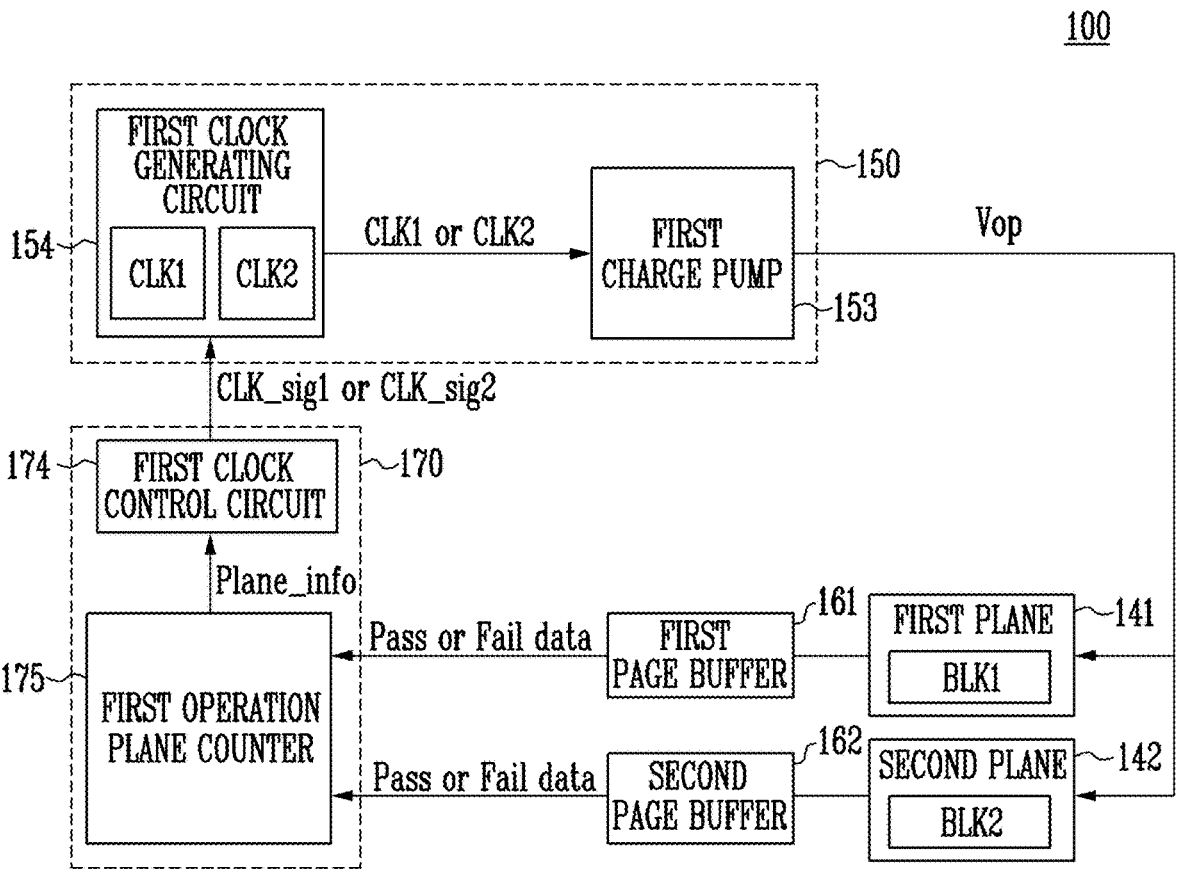
FIGS. 10 and 11 are diagrams illustrating a memory device for determining a cycle of a clock signal according to operation plane information respectively provided by a first operation plane counter and a second operation plane counter.
Figure 11:
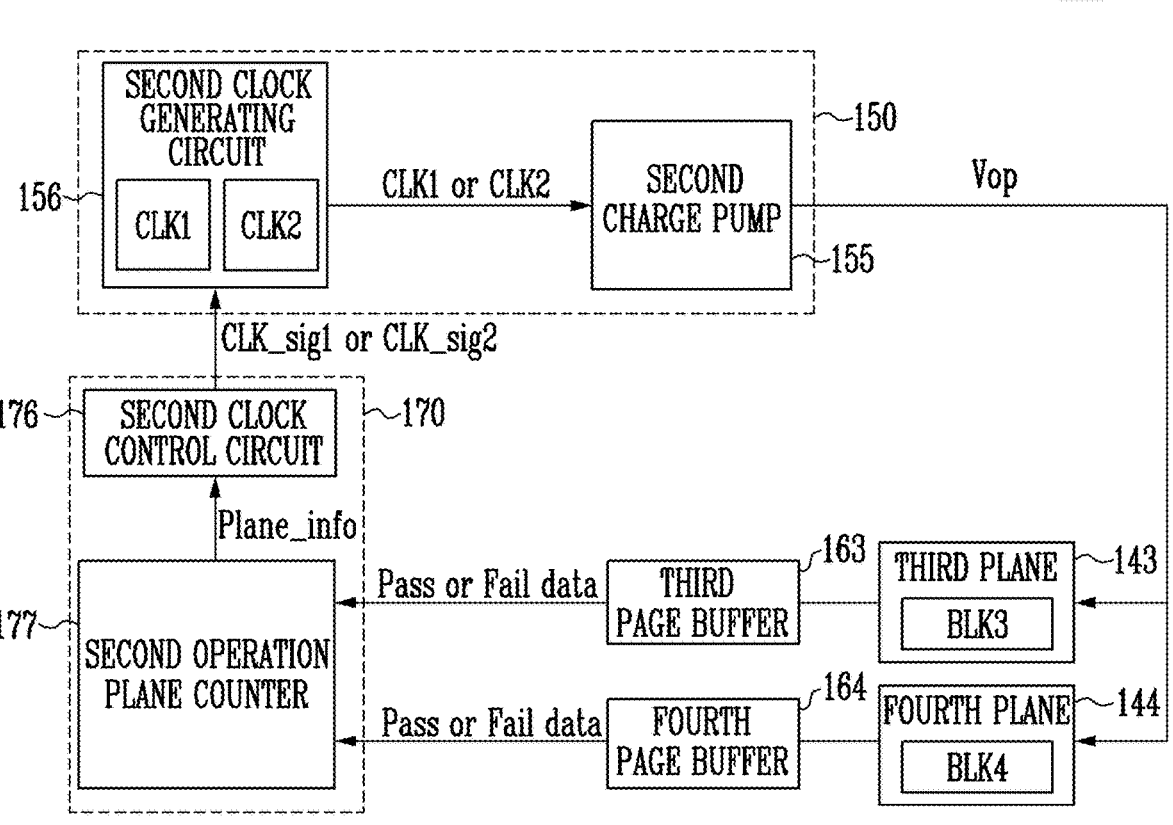

FIGS. 10 and 11 are diagrams illustrating a memory device for determining a cycle of a clock signal according to operation plane information respectively provided by a first operation plane counter and a second operation plane counter.

Referring to FIGS. 10 and 11, the voltage generating circuit 150 may include a plurality of clock generating circuits and a plurality of charge pumps. The operation control circuit 170 may include a plurality of clock control circuits and a plurality of operation plane counters. In an embodiment, the voltage generating circuit 150 may include first and second charge pumps 153 and 155 and first and second clock generating circuits 154 and 156. In an embodiment, the operation control circuit 170 may include first and second clock control circuits 174 and 176 and first and second operation plane counters 175 and 177.

In an embodiment, the first charge pump 153 may provide the first and second planes 141 and 142 with operating voltages Vop generated according to a first clock signal CLK1 or a second clock signal CLK2. The second charge pump 155 may provide operating voltage Vop to the third and fourth planes 143 and 144.

The first operation plane counter 175 may receive, from the first and second page buffers 161 and 162, pass data or fail data, which represents whether an operation on each of the first and second memory blocks BLK1 and BLK2 respectively included in the first and second plane 141 and 142 has been completed. Based on a number of pass data received from the first and second page buffers 161 and 162, the first operation plane counter 175 may generate operation plane information Plane_info representing a number of planes to operate.

The first clock control circuit 174 may output a first clock control signal CLK_sig1 or the second clock control signal CLK_sig2 based on a result obtained by comparing information regarding the number of planes to operate, which is included in the operation plane information Plane_info received from the first opening plane counter 175, with a threshold number. The first clock generating circuit 154 may output the first clock signal CLK1 or the second clock signal CLK2 in response to the first clock control signal CLK_sig1 or the second clock control signal CLK_sig2, which is received from the first clock control circuit 174. The first charge pump 153 may generate operating voltages Vop in response to the first clock signal CLK1 or the second clock signal CLK2, which is received from the first clock generating circuit 154.

The second operation plane counter 177 may receive, from the third and fourth page buffers 163 and 164, pass data or fail data, which represents whether an operation on each of the third and fourth memory blocks BLK3 and BLK4, respectively included in the third and fourth planes 143 and 144, has been completed. Based on a number of pass data received from the third and fourth page buffers 163 and 164, the second operation plane counter 177 may generate operation plane information Plane_info representing a number of planes to operate.

The second clock control circuit 176 may output the first clock control signal CLK_sig1 or the second clock control signal CLK_sig2 based on a result obtained by comparing information regarding the number of planes to operate, which is included in the operation plane information Plane_info received from the second operation plane counter 177, with the threshold number. The second clock generating circuit 156 may output the first clock signal CLK1 or the second clock signal CLK2 in response to the first clock control signal CLK_sig1 or the second clock control signal CLK_sig2, which is received from the second clock control circuit 176. The second charge pump 155 may generate operating voltages Vop in response to the first clock signal CLK1 or the second clock signal CLK2, which is received from the second clock generating circuit 156.

In an embodiment, a plurality of memory blocks included in different planes may simultaneously perform an operation corresponding to a command. The memory device 100 may change the cycle of a clock signal from a first cycle to a second cycle, which is longer than the first cycle, based on a number of memory blocks on which the operation corresponding to the command has been completed, among the plurality of memory blocks. When a number of memory blocks on which the operation has been completed in a first loop is greater than a threshold number, the memory device 100 may generate operating voltages Vop according to a clock signal having the second cycle in a second loop. When the number of memory blocks on which the operation has been completed in the first loop is less than the threshold number, the memory device 100 may generate operating voltages Vop according to a clock signal having the first cycle in the second loop.

FIG. 12 is a flowchart illustrating a memory device for generating an operating voltage according to a clock signal determined based on a number of pass data.

Referring to FIG. 12, in step S1201, the memory device 100 may receive a command and an address from the memory controller 200.

In step S1203, the memory device 100 may generate an operating voltage in response to a first clock signal having a first cycle. The operating voltage may be provided to each of a plurality of planes.

In step S1205, each of the plurality of planes may perform an operation corresponding to the command by using the operating voltage.

In step S1207, the memory device 100 may decide whether the operation on each of the plurality of planes has been completed. When pass data is stored in each of a plurality of page buffers respectively connected to the plurality of planes, the operation on each of the plurality of planes may be completed. When the operation on each of the plurality of planes is completed, the step may be ended. When the operation on each of the plurality of planes is not completed, step S1209 may be performed. When at least one fail data is stored in the plurality of page buffers respectively connected to the plurality of planes, the operation on each of the plurality of planes might not be completed.

In step S1209, the memory device 100 may increase a program voltage or an erase voltage by a step voltage.

In step S1211, the memory device 100 may compare whether a number of pass data stored in the plurality of page buffers is equal to or greater than a threshold number. When the number of pass data stored in the plurality of page buffers is equal to or greater than the threshold number, step S1213 may be performed. When the number of pass data stored in the plurality of page buffers is less than the threshold number, step S1203 may be performed.

In step S1213, when the number of pass data stored in the plurality of page buffers is equal to or greater than the threshold number, the memory device 100 may generate an operating voltage in response to a second clock signal having a second cycle. The second clock signal may be a clock signal having a cycle that is longer than the cycle of the first clock signal. After that, the memory device 100 may perform the operation corresponding to the command by using the operating voltage generated according to the second clock signal.

Figure 13:
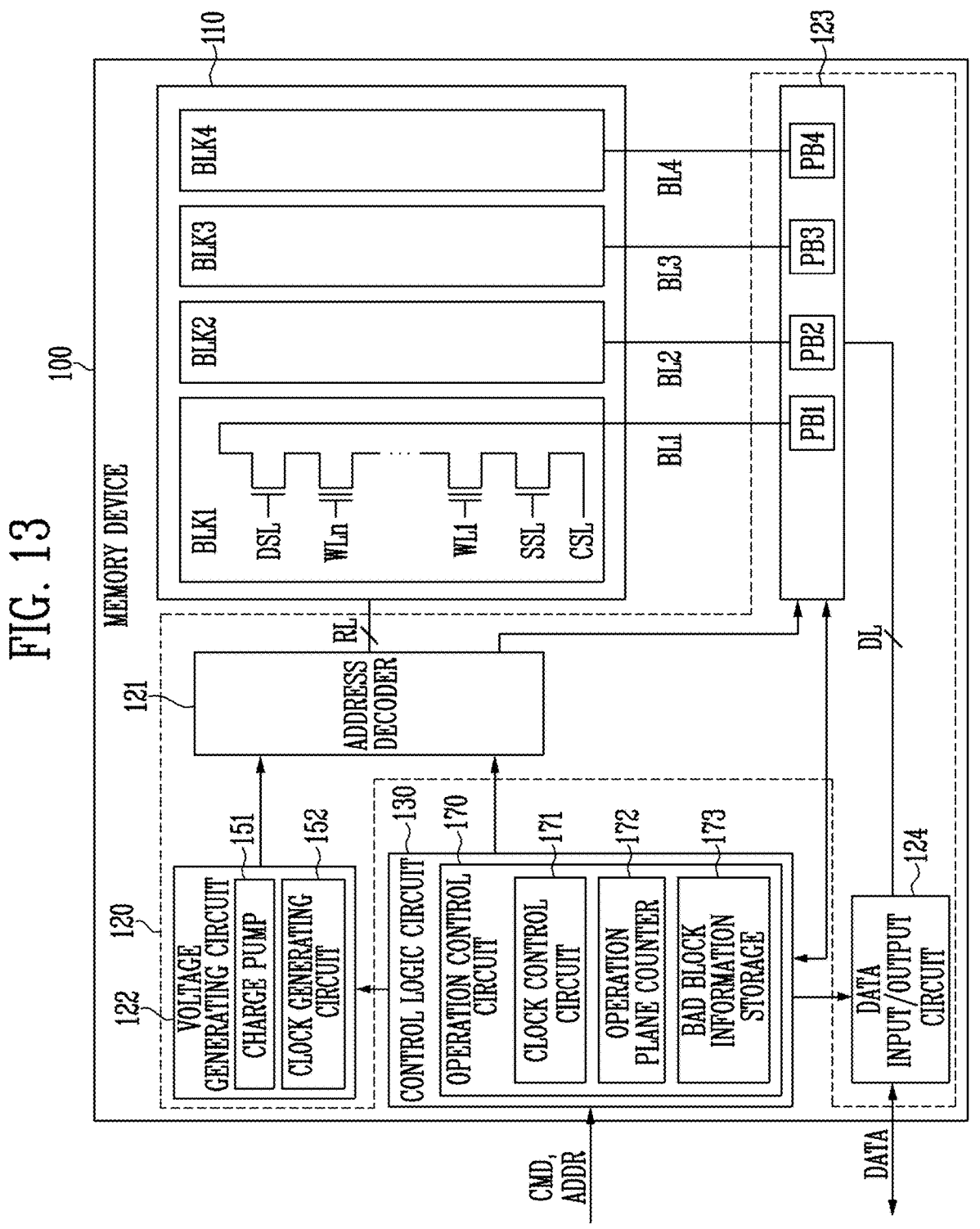
FIG. 13 is a diagram illustrating a structure of a memory device.

FIG. 13 is a diagram illustrating a structure of a memory device.

Referring to FIG. 13, the memory device 100 may include a memory cell array 110, a peripheral circuit 120, and a control logic circuit 130.

The memory cell array 110 may include a plurality of memory blocks BLK1 to BLK4. The plurality of memory blocks BLK1 to BLK4 may be connected to an address decoder 121 through row lines RL. The plurality of memory blocks BLK1 to BLK4 may be connected to a page buffer group 123 through bit lines BL1 to BL4. Each of the plurality of memory blocks BLK1 to BLK4 may include a plurality of memory cells. In an embodiment, the plurality of memory cells may be nonvolatile memory cells. The plurality of memory blocks BLK1 to BLK4 may simultaneously perform an operation corresponding to a command CMD.

In an embodiment, any one memory block BLK1, among the plurality of memory blocks BLK1 to BLK4, may include a plurality of word lines WL1 to WLn arranged in parallel to each other between a drain select line DSL and a source select line SSL. A plurality of memory cells may be connected to the plurality of word lines WL1 to WLn. The memory block BLK1 may include a memory cell string connected between any one bit line and a common source line CSL. Each of the bit lines BL1 to BL4 may be respectively connected to a plurality of memory cell strings, and the common source line CSL may be commonly connected to the plurality of memory cell strings.

Each of the plurality of memory cells may be configured as a Single Level Cell (SLC) storing one-bit data, a Multi-Level Cell (MLC) storing two-bit data, a Triple Level Cell (TLC) storing three-bit data, a Quad Level Cell (QLC) storing four-bit data, or a memory cell storing five-or-more-bit data.

The peripheral circuit 120 may drive the memory cell array 110. For example, the peripheral circuit 120 may drive the memory cell array 110 to perform a program operation, a read operation, and an erase operation under the control of the control logic circuit 130. In another example, the peripheral circuit 120 may apply various operating voltages to the row lines RL and the bit lines BL1 to BL4 or may discharge the applied voltages under the control of the control logic circuit 130.

The peripheral circuit 120 may include the address decoder 121, a voltage generating circuit 122, the page buffer group 123, and a data input/output circuit 124.

The address decoder 121 may be connected to the memory cell array 110 through the row lines RL. The row lines RL may include drain select lines DSL, a plurality of word lines WL to WLn, and source select lines SSL.

The address decoder 121 may be operated under the control of the control logic circuit 130.

In a program operation, the address decoder 121 may apply a program voltage to the selected word line and may apply a pass voltage having a level that is lower than a level of the program voltage to unselected word lines. In a program verify operation, the address decoder 121 may apply a verify voltage to the selected word line and may apply a verify pass voltage having a level that is higher than a level of the verify voltage to the unselected word lines.

The voltage generating circuit 122 may generate a plurality of operating voltages by using an external power voltage supplied to the memory device 100. The voltage generating circuit 122 may be operated under the control of the control logic circuit 130.

In an embodiment, the voltage generating circuit 122 may generate various operating voltages used for program, read, and erase operations. For example, the voltage generating circuit 122 may generate a plurality of erase voltages, a plurality of program voltages, a plurality of pass voltages, a plurality of select read voltages, and a plurality of unselect read voltages. The plurality of generated operating voltages may be supplied to the memory cell array 110 by the address decoder 121.

In an embodiment, the voltage generating circuit 122 may include a charge pump 151 and a clock generating circuit 152. The clock generating circuit may generate a clock signal. The charge pump may perform a pump operation that generates operating voltages in response to the clock signal.

The page buffer group 123 may include first to fourth page buffers PB1 to PB4. The first to fourth page buffers PB1 to PB4 may be connected to the memory cell array 110 respectively through the first to fourth bit lines BL1 to BL4. The first to fourth page buffers PB1 to PB4 may be operated under the control of the control logic circuit 130.

In a program operation, the first to fourth page buffers PB1 to PB4 may transfer data received through the data input/output circuit 124 to selected memory cells through the bit lines BL1 to BL4. The selected memory cells may be programmed according to the transferred data. In a verify operation, the first to fourth page buffers PB1 to PB4 may read data stored in the selected memory cells through the bit lines BL1 to BL4 from the selected memory cells.

The data input/output circuit 124 may be connected to the first to fourth page buffers PB1 to PB4 through data lines DL. The data input/output circuit 124 may be operated under the control of the control logic circuit 130.

The control logic circuit 130 may be connected to the address decoder 121, the voltage generating circuit 122, the page buffer group 123, and the data input/output circuit 124. The control logic circuit 130 may control a general operation of the memory device 100. The control logic circuit 130 may be operated in response to a command CMD transferred from the memory controller 200.

The control logic circuit 130 may control the peripheral circuit 120 by generating several signals in response to a command CMD and an address ADDR.

In an embodiment, the control logic circuit 130 may include an operation control circuit 170. The operation control circuit 170 may include a clock control circuit 171, an operation plane counter 172, and a bad block information storage 173.

The operation plane counter 172 may generate operation plane information representing a number of planes to operate based on bad block information stored in the bad block information storage 173 and a number of pass data received from the first to fourth page buffers PB1 to PB4.

The clock control circuit 171 may output a clock control signal based on the operation plane information. The clock generating circuit 152 may provide the charge pump 151 with a clock signal corresponding to the clock control signal received from the clock control circuit 171.

In accordance with the present disclosure, there can be provided a memory device capable of decreasing an amount of current consumed by a charge pump for generating a voltage, and an operating method of the memory device.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a memory cell array including a plurality of planes;
a charge pump configured to generate an operating voltage used for an operation on each of the plurality of planes according to a first clock signal having a first cycle;
page buffers each configured to store pass data representing whether an operation of each of the plurality of planes has been completed; and
an operation control circuit configured to, based on a number of the pass data received from the page buffers, control the charge pump to generate the operating voltage according to a second clock signal having a second cycle that is longer than the first cycle.

2. The memory device of claim 1, wherein the operation control circuit includes an operation plane counter configured to, based on the number of the pass data received from the page buffers, generate operation plane information representing a number of remaining planes, among the plurality of planes, the remaining planes being planes other than planes on which the operation has been completed.

3. The memory device of claim 2, wherein the operation control circuit includes a clock control circuit configured to output a clock control signal based on a result obtained by comparing the number of the remaining planes with a threshold number.

4. The memory device of claim 3, further comprising a clock generating circuit configured to output the first clock signal or the second clock signal in response to the clock control signal.

5. The memory device of claim 3, wherein the clock control circuit is configured to output a clock control signal corresponding to the first clock signal when the number of the remaining planes is greater than the threshold number.

6. The memory device of claim 3, wherein the clock control circuit is configured to output a clock control signal corresponding to the second clock signal when the number of the remaining planes is equal to or less than the threshold number.

7. The memory device of claim 1, wherein the operation includes a plurality of loops, and wherein, when the number of the pass data received from the page buffers is greater than a threshold number in a first loop, among the plurality of loops, the operation control circuit is configured to control the charge pump to generate the operating voltage according to the second clock signal in a second loop, among the plurality of loops.

8. The memory device of claim 1, wherein page buffers connected to planes on which the operation has been completed, among the page buffers, store the pass data, and wherein page buffers connected to planes on which the operation has not been completed, among the page buffers, store fail data.

9. The memory device of claim 1, wherein the operation includes a verify operation, and wherein each of the page buffers stores the pass data when the verify operation on each of the plurality of planes passes.

10. The memory device of claim 9, wherein the verify operation passes when a threshold voltage of each of a plurality of memory cells included in each of the plurality of planes increases to a threshold voltage corresponding to a target program state or decreases to a threshold voltage corresponding to an erase state.

11. A memory device comprising:

a plurality of memory blocks included in different planes;

a clock generating circuit configured to generate a clock signal;

a charge pump configured to generate an operating voltage to be applied to each of the plurality of memory blocks in response to the clock signal; and an operation control circuit configured to, based on a number of memory blocks on which an operation corresponding to a command has been completed, among the plurality of memory blocks, control the clock generating circuit to change a cycle of the clock signal from a first cycle to a second cycle that is longer than the first cycle.

12. The memory device of claim 11, wherein, when a number of memory blocks on which the operation has been completed in a first loop, among a plurality of loops included in the operation, is greater than a threshold number, the operation control circuit is configured to control the clock generating circuit to generate a clock signal having the second cycle in a second loop, among the plurality of loops.

13. The memory device of claim 12, wherein the operating control circuit is configured to control the charge pump to apply the operating voltage to each remaining memory block other than the memory blocks on which the operation has been completed, among the plurality of memory blocks in the second loop.

14. The memory device of claim 11, wherein the operation control circuit includes a bad block information storage configured to store information on a bad block, among the plurality of memory blocks.

15. The memory device of claim 14, wherein the operation control circuit includes an operation plane counter configured to, based on information regarding a number of memory blocks on which the operation has been completed in a first loop, among the plurality of loops, and information on the bad block, generate information regarding a number of memory blocks on which the operation is to be performed in a second loop, among a plurality of loops included in the operation, among the plurality of memory blocks.

16. The memory device of claim 15, wherein the operation control circuit includes a clock control circuit configured to provide the clock generating circuit with a clock control signal corresponding to a clock signal having the second cycle in the second loop when a number of memory blocks on which the operation is to be performed is less than a threshold number.

17. The memory device of claim 11, wherein an operation on any one memory block, among the plurality of memory blocks, is completed when a threshold voltage of each of a plurality of memory cells included in the one memory block increases to a threshold voltage corresponding to a target program state or decreases to a threshold voltage corresponding to an erase state.

18. A method of operating a memory device, the method comprising:

generating an operating voltage according to a first clock signal having a first cycle in a first loop;

storing data representing whether an operation on each of a plurality of planes has been completed in the first loop; and generating, based on a number of pass data representing that the operation on each of the plurality of planes has been completed in the first loop, the operating voltage according to a second clock signal having a second cycle that is longer than the first cycle in a second loop.

19. The method of claim 18, wherein, in the generating of the operating voltage according to the second clock signal, the operating voltage is generated according to the second clock signal in the second loop when a number of the pass data is greater than a threshold number in the first loop.

20. The method of claim 19, wherein, in the generating of the operating voltage according to the second clock signal, the operating voltage is provided to planes on which the operation has not been completed, among the plurality of planes, in the second loop.

21. A memory device comprising:

a memory cell array including a plurality of planes; and a control circuit configured to generate a first clock signal having a first period when a number of an operating plane, among the plurality of planes, is greater than a threshold number and configured to generate a second clock signal having a second period longer than the first period when the number of the operating plane of the plurality of planes is equal to or less than the threshold number.

22. The memory device of claim 21, wherein the control circuit comprises:

a voltage generating circuit configured to generate an operating voltage for driving the plurality of planes in response to at least one of the first clock signal and the second clock signal; and an operation control circuit including an operation plane counter configured to count the number of the operating plane, among the plurality of planes.

5

\* \* \* \* \*